United States Patent
Chen et al.

(10) Patent No.: US 12,006,208 B2
(45) Date of Patent: Jun. 11, 2024

(54) MICRO-ELECTROMECHANICAL SYSTEM DEVICE INCLUDING A PRECISION PROOF MASS ELEMENT AND METHODS FOR FORMING THE SAME

(71) Applicant: Taiwan Semiconductor Manufacturing Company Limited, Hsinchu (TW)

(72) Inventors: Ting-Jung Chen, Kaohsiung (TW); Shih-Wei Lin, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/304,383

(22) Filed: Apr. 21, 2023

(65) Prior Publication Data

US 2023/0249963 A1 Aug. 10, 2023

Related U.S. Application Data

(62) Division of application No. 17/181,624, filed on Feb. 22, 2021, now Pat. No. 11,634,320.

(51) Int. Cl.
*B81C 1/00* (2006.01)

(52) U.S. Cl.
CPC ...... *B81C 1/00063* (2013.01); *B81C 1/00047* (2013.01); *B81C 1/00523* (2013.01); *B81C 2201/013* (2013.01)

(58) Field of Classification Search
CPC ............ B81C 1/00063; B81C 1/00047; B81C 1/00523; B81C 2201/013; B81C 2201/0132; B81C 2201/0133; B81C 2201/0178; B81C 1/00198; B81C 1/00015; G01P 15/125; B81B 2201/0235; B81B 2203/0136; B81B 7/02

See application file for complete search history.

(56) References Cited

U.S. PATENT DOCUMENTS

| | | |
|---|---|---|
| 6,388,300 B1 | 5/2002 | Kano et al. |
| 2005/0051092 A1 | 3/2005 | Makino et al. |
| 2011/0030472 A1* | 2/2011 | Aziz ............... G01P 15/0802 216/13 |
| 2012/0262026 A1 | 10/2012 | Lin et al. |
| 2015/0183636 A1 | 7/2015 | Akiba et al. |
| 2016/0332864 A1* | 11/2016 | Iihola ............... B81B 3/0094 |

\* cited by examiner

*Primary Examiner* — Yasser A Abdelaziez
(74) *Attorney, Agent, or Firm* — The Marbury Law Group, PLLC

(57) ABSTRACT

A semiconductor oxide plate is formed on a recessed surface in a semiconductor matrix material layer. Comb structures are formed in the semiconductor matrix material layer. The comb structures include a pair of inner comb structures spaced apart by a first semiconductor portion. A second semiconductor portion that laterally surrounds the first semiconductor portion is removed selective to the comb structures using an isotropic etch process. The first semiconductor portion is protected from an etchant of the isotropic etch process by the semiconductor oxide plate, the pair of inner comb structures, and a patterned etch mask layer that covers the comb structures. A movable structure for a MEMS device is formed, which includes a combination of the first portion of the semiconductor matrix material layer and the pair of inner comb structures.

20 Claims, 21 Drawing Sheets

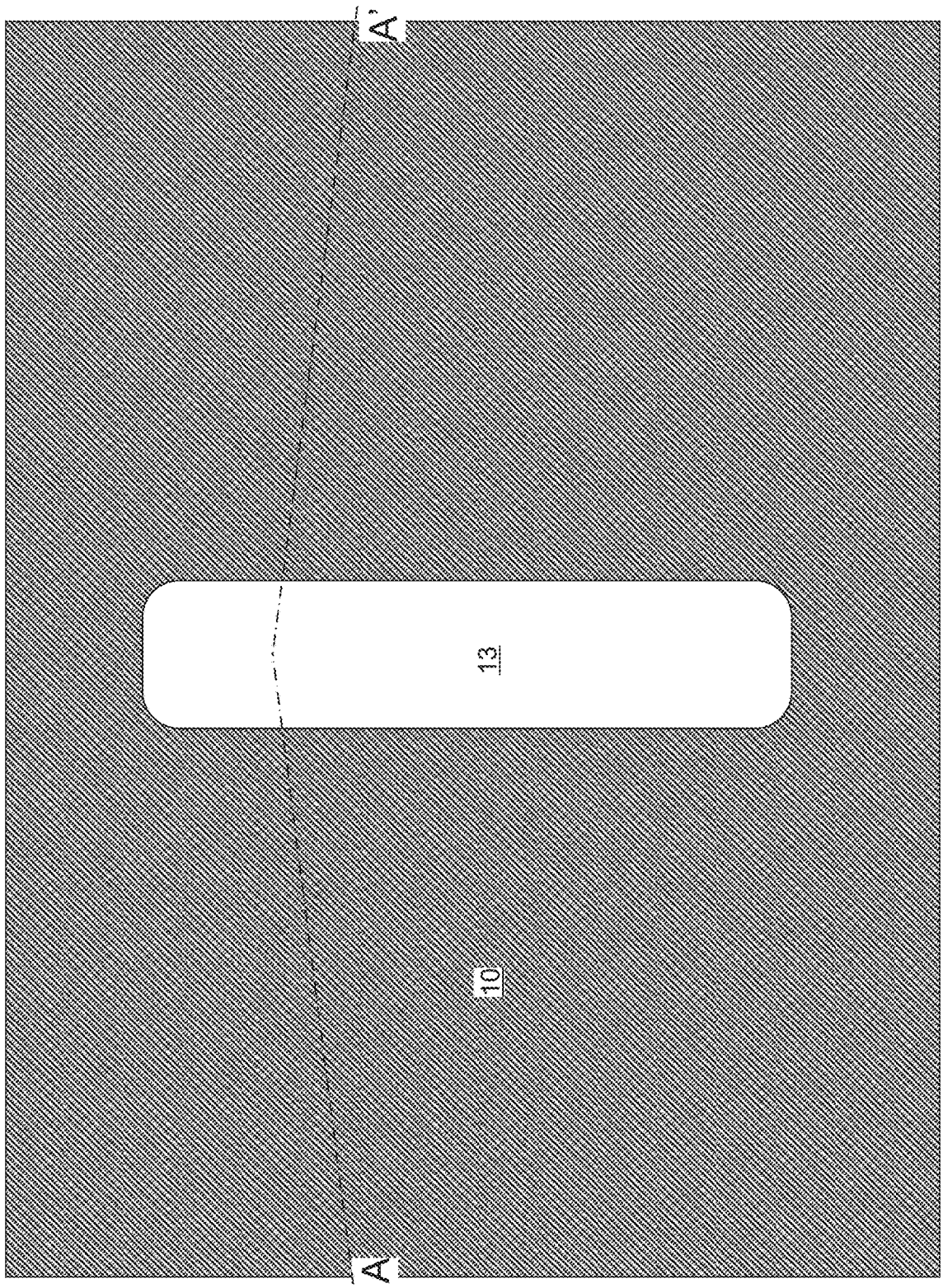

MICRO-ELECTROMECHANICAL SYSTEM DEVICE INCLUDING A PRECISION PROOF MASS ELEMENT AND METHODS FOR FORMING THE SAME

RELATED APPLICATIONS

This application is a divisional application of U.S. application Ser. No. 17/181,624, entitled "Micro-Electromechanical System Device Including a Precision Proof Mass Element and Methods for Forming the Same," filed on Feb. 22, 2021, the entire contents of which are incorporated herein by reference for all purposes.

BACKGROUND

Micro-electro mechanical system (MEMS) devices include devices fabricated using semiconductor technology to form mechanical and electrical features. MEMS devices may include moving parts having dimensions of microns or sub-microns and a mechanism for electrically coupling the moving parts to an electrical signal. The electrical signal may be an input signal that induces movement of the moving parts or an output signal that is generated by the movement of the moving parts. MEMS devices are useful devices that may be integrated with other devices, such as semiconductor devices, to function as sensors or as actuators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5B is a horizontal cross-sectional view of the exemplary structure along the plane B-B' of FIG. 5A. The hinged vertical plane A-A' is the plane of the vertical cross-sectional view of FIG. 5A.

DETAILED DESCRIPTION

Figure 1A:
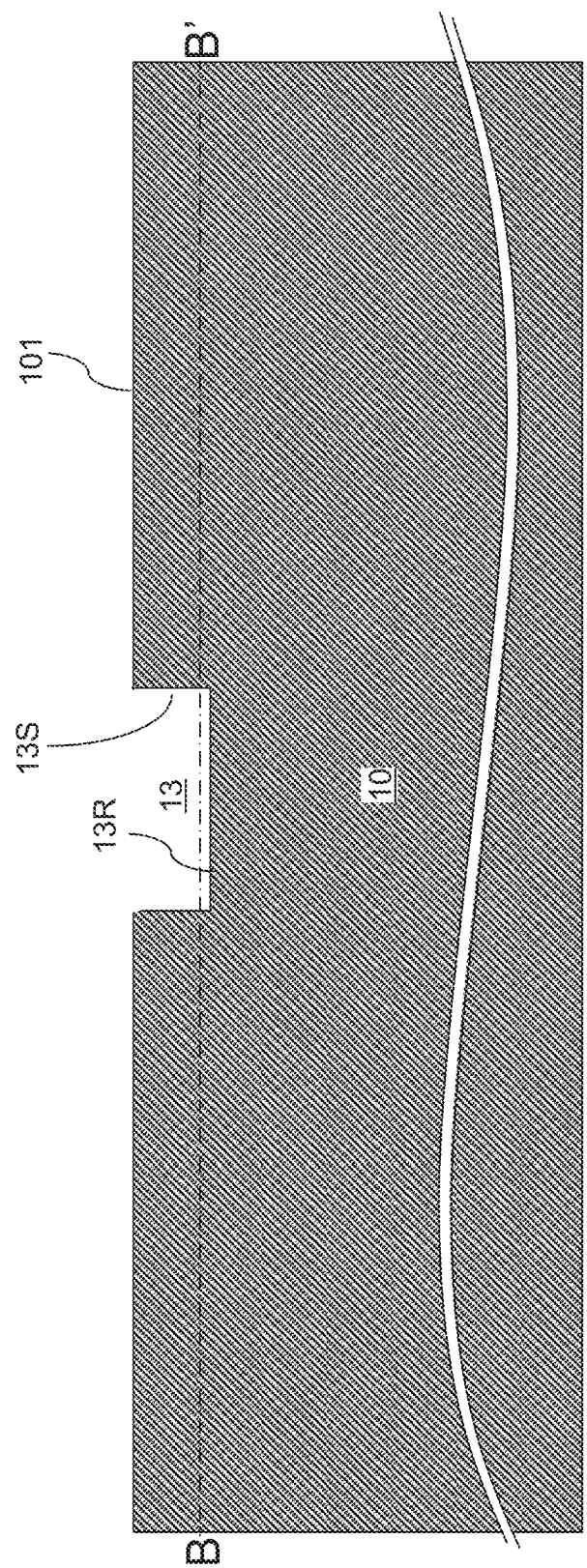
FIG. 1A is a vertical cross-sectional view of an exemplary structure including a semiconductor matrix material layer after formation of a recess cavity according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many MEMS devices utilize an accurate proof mass to accurately measure physical parameters. For example, an accelerometer converts the displacement of a movable element into acceleration, for example, by measuring a capacitance change that the displacement of the movable element induces. The displacement of the movable element is proportional to the force applied to the movable element, which is proportional to the mass of a proof mass element within the movable element. Process variations in the isotropic etch process may cause variations in the mass of the proof mass element. Variations in the mass of the proof of mass element may result in variations (i.e., inaccuracies) in the measurement of acceleration. Thus, a precise proof mass element with reduced mass variations that may be caused by a manufacture process may enhance the precision of measurement in some MEMS devices.

Generally, embodiments of the present disclosure are directed to a microstructure including a micro-electromechanical system (MEMS) device. The MEMS device contains a proof mass for measuring movement of an object to which the MEMS device is attached. For example, the MEMS device may include an accelerometer. Embodiments of the present disclosure may be used to form a high precision proof mass for the MEMS device.

Specifically, a semiconductor matrix material layer may be provided, which includes a semiconductor material to be subsequently patterned into a movable structure including a proof mass and a semiconductor matrix layer containing a cavity within which the movable structure may be confined. A surface portion of the semiconductor matrix layer may be vertically recessed from a first horizontal surface to form a recess cavity. A diffusion barrier spacer such as a silicon nitride spacer may be formed on the sidewall of the recess cavity. An oxidation process may be performed to form a first semiconductor oxide plate on the recessed horizontal surface of the recess cavity and a second semiconductor oxide plate on the un-recessed portion of the first horizontal surface of the semiconductor matrix material layer. The diffusion barrier spacer may be removed selective to the semiconductor oxide plated using an isotropic selective etch process. The second semiconductor oxide plate may be bonded to a handle substrate.

Comb trenches may be formed from a second horizontal surface of the semiconductor matrix material layer toward the first horizontal surface of the semiconductor matrix material layer. The comb trenches may include two interdigitated pairs of a respective inner comb trench and a respective outer comb trench. A first portion of the semiconductor matrix material layer to be subsequently patterned into a proof mass, i.e., a center mass portion, may be located between the two inner comb trenches. The outer comb trenches may be connected by comb shaft extension trenches. The outer comb trenches and the comb shaft extension trenches collectively enclose all inner comb trenches, and define a lateral boundary for a cavity to be subsequently formed. The common comb shaft cavity portion may define a boundary of a cavity in which a movable element to be subsequently formed is laterally confined. A dielectric liner layer and a conductive fill material may be deposited in the comb trenches, and excess portions of the dielectric liner layer and the conductive fill material located above the horizontal plane including the top surface of the semiconductor matrix material layer may be removed by a planarization process. Remaining portions of the dielectric liner layer and the conductive fill material in each comb trench comprise comb structures. The comb structures include inner comb structures formed in the inner comb trenches and outer comb structures formed in the outer comb trenches.

An etch mask layer such as a photoresist layer may be formed over the second horizontal surface of the semiconductor matrix material layer, and may be patterned to provide openings within the area enclosed by a common comb shaft portion of the outer comb structures. The openings may be formed in areas that do not overlie the comb structures so that each comb structure is covered by the patterned etch mask layer. A second portion of the semiconductor matrix material layer located outside the comb structures and within the area enclosed by the common comb shaft portion of the outer comb structures may be etched using an isotropic etch process. The first semiconductor oxide plate, the inner comb structures, and the patterned etch mask layer protect the first portion of the semiconductor matrix material layer during the isotropic etch process. Particularly, the first portion of the semiconductor matrix material layer that becomes a proof mass structure is protected from underneath by the first semiconductor oxide plate, and thus, has a uniform thickness through a predominant portion thereof.

A movable structure including the center mass portion, the inner comb structure, and the outer comb structure may be detached from the second semiconductor oxide plate. The volume from which the material of the semiconductor material layer may be etched forms a cavity that is laterally confined by the common comb shaft portion of the outer comb structures. A semiconductor die including suitable electrical contact structures for the comb structures may be attached to a semiconductor matrix layer, which is a remaining portion of the semiconductor matrix material layer located outside the cavity. The semiconductor die may include suitable contact structures that may electrically bias various portions of the comb structures in a configuration that provides a capacitor structure. The capacitor structure may be configured in any configuration that generates a change in the capacitance when the movable structure moves relative to a stationary structure including the outer comb structures. The microstructure may include an accelerometer that may detect acceleration of a system to which the microstructure is attached. The various aspects of embodiments of the present disclosure are described in further detail below.

Figure 1B:
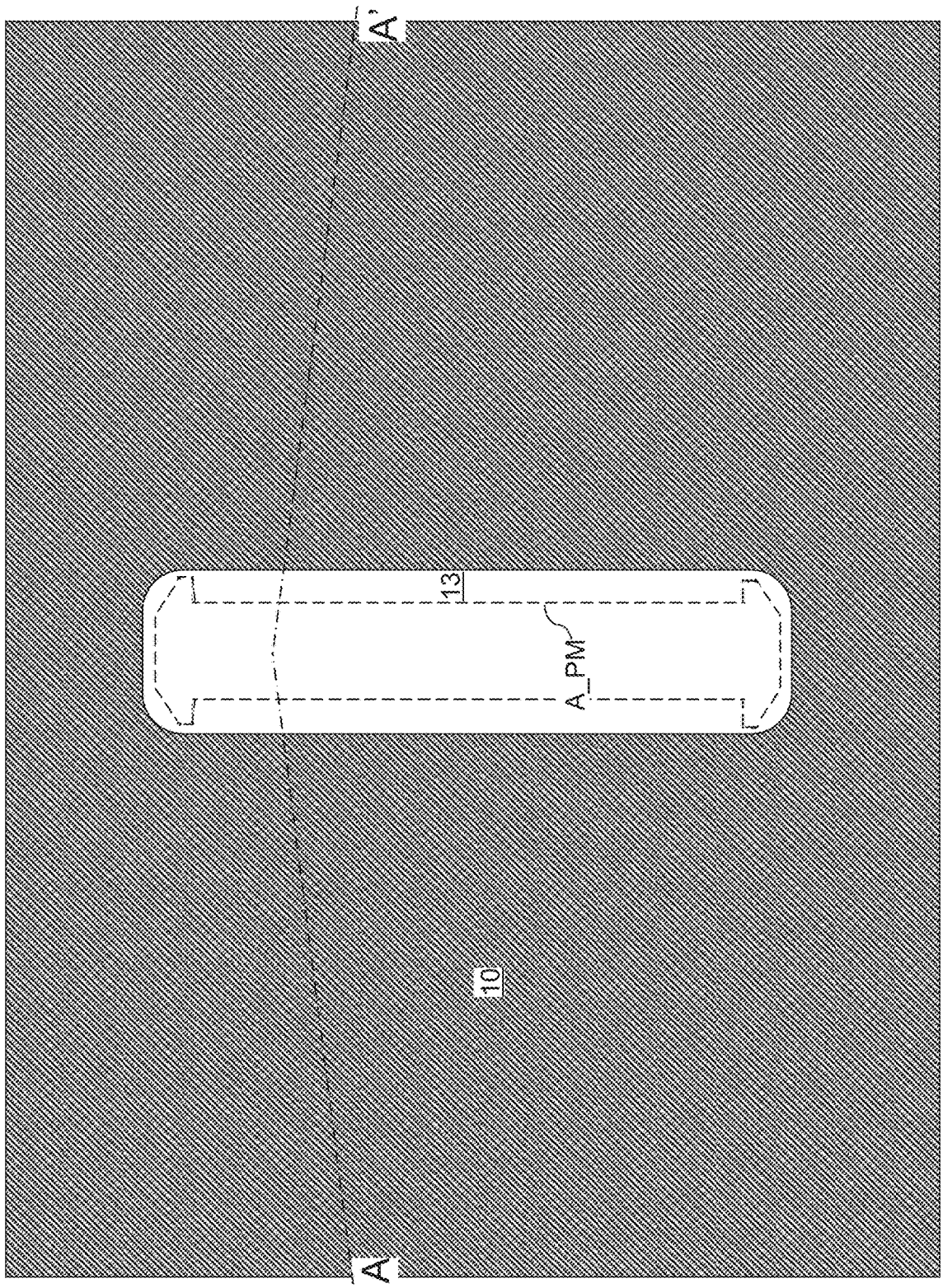
FIG. 1B is a horizontal cross-sectional view of the exemplary structure along the horizontal plane B-B' of FIG. 1A.

Referring to FIGS. 1A and 1B, a semiconductor matrix material layer 10 is illustrated, which may be provided as a planar structure including a first horizontal surface 101 on a first side and a backside surface (i.e., second horizontal surface) on a second side with an uniform thickness throughout, but not necessarily limited thereby. The semiconductor matrix material layer 10 includes a first semiconductor material, which may be a single crystalline semiconductor material or a polycrystalline semiconductor material. In one embodiment, the semiconductor matrix material layer 10 may include a single crystalline semiconductor layer such as a single crystalline silicon layer. The uniform thickness of the semiconductor matrix material layer 10 may be in a range from 30 microns to 1 mm, such as from 100 microns to 600 microns. While a region for forming a single accelerometer is illustrated in FIGS. 1A and 1B, it is understood that a two-dimensional array of accelerometers may be formed on a single wafer. Thus, the pattern illustrated in FIGS. 1A and 1B may be repeated in pattern of a two-dimensional array over the semiconductor matrix material layer 10.

A photoresist layer (not shown) may be applied over the first horizontal surface 101 of the semiconductor matrix material layer 10, and may be lithographically patterned to form an opening having a general shape of a proof mass (which is also referred to as a center mass portion) to be subsequently formed. In one embodiment, the periphery of the opening in the photoresist layer may be laterally offset outward from a periphery of the proof mass to be subsequently formed by a lateral offset distance, which may be, for example, in a range from 0.5 micron to 30 microns. Thus, the area of the opening in the photoresist layer may have a greater area than the area (A_PM) of the proof mass to be subsequently formed. In a non-limiting illustrative example, the opening in the photoresist layer may have an elongated rounded rectangular shape with a lengthwise dimension in a range from 300 microns to 6 mm, and a widthwise dimension in a range from 30 microns to 600 microns, although lesser and greater dimensions may also be used.

The pattern of the opening in the photoresist layer may be transferred into an upper portion of the semiconductor matrix material layer 10 by an etch process, which may include an anisotropic etch process or an isotropic etch process. A recess cavity 13 that is vertically recessed from the first horizontal surface 101 of the semiconductor matrix material layer 10 may be formed. A recessed horizontal surface may be provided at the bottom of the recess cavity 13. The recess depth of the recess cavity 13 may be in a range from 0.3 micron to 10 microns, such as from 0.6 microns to 5 microns, although lesser and greater recess depths may also be used. The recess cavity 13 has sidewalls 13S that connect a recessed bottom surface 13R of the recess cavity 13 to the un-recessed portions of the first horizontal surface 101 of the semiconductor matrix material layer 10. The photoresist layer may be subsequently removed, for example, by ashing.

Figure 2:
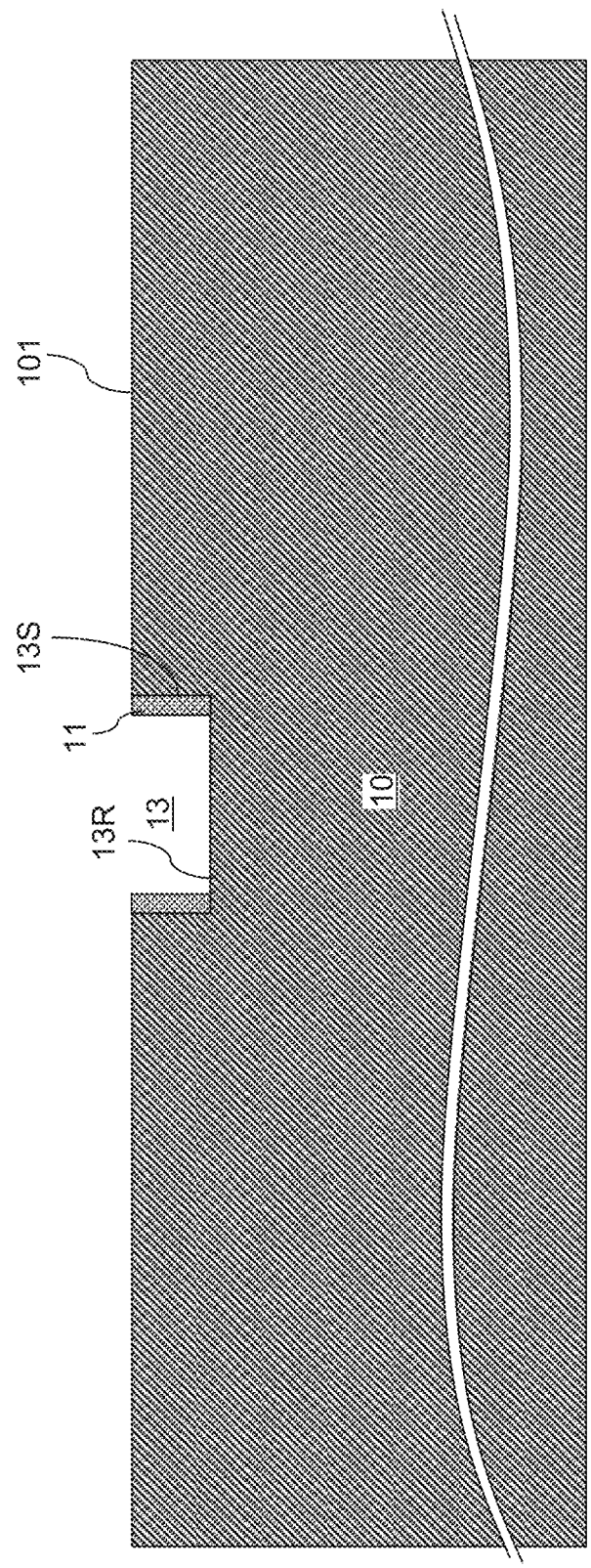
FIG. 2 is a vertical cross-sectional view of the exemplary structure after formation of a diffusion barrier spacer at a periphery of the recess cavity according to an embodiment of the present disclosure.

Referring to FIG. 2, a diffusion barrier spacer 11 (also referred to as a blocking spacer) including a diffusion barrier material may be formed at the periphery of the recess cavity 13. The diffusion barrier spacer 11 includes a material that blocks diffusion of oxygen therethrough. For example, the diffusion barrier spacer 11 may include, and/or may consist essentially of, silicon nitride. Other suitable materials are within the contemplated scope of disclosure. In some embodiments, the blocking spacer 11 can be any material, and is configured to protect the sidewalls 13S of the recess cavity 13 from the following formed semiconductor oxide plates (plates 12A and 12B in FIG. 3). The diffusion barrier spacer 11 may be formed, for example, by conformally depositing a diffusion barrier material layer (such as a silicon nitride layer or a metallic nitride layer including a metallic nitride material (e.g., TaN, TiN, or WN)) on the recessed bottom surface 13R and the sidewalls 13S of the recess cavity 13 and on un-recessed portions of the first horizontal surface 101 of the semiconductor matrix material layer 10. In other embodiments, the diffusion barrier spacer 11 may be formed by denaturing portions of the semiconductor matrix material layer 10. The thickness of the diffusion barrier material layer may be in a range from 30 nm to 200 nm, although lesser and greater thicknesses may also be used. An anisotropic etch process may be performed to remove horizontal portions of the diffusion barrier material layer deposited on the recessed bottom surface of the recess cavity and on un-recessed portions of the first horizontal surface 101 of the semiconductor matrix material layer 10. The remaining vertical portion of the diffusion barrier material layer constitutes the diffusion barrier spacer 11. In one embodiment, each sidewall 13S of the recess cavity 13 may contact a respective outer sidewall of the diffusion barrier spacer 11. The diffusion barrier spacer 11 may have a generally tubular shape, and thus, may be topologically homeomorphic to a torus, i.e., may be continuously deformed into a torus without creating a new hole or destroying a pre-existing hole.

Figure 3:
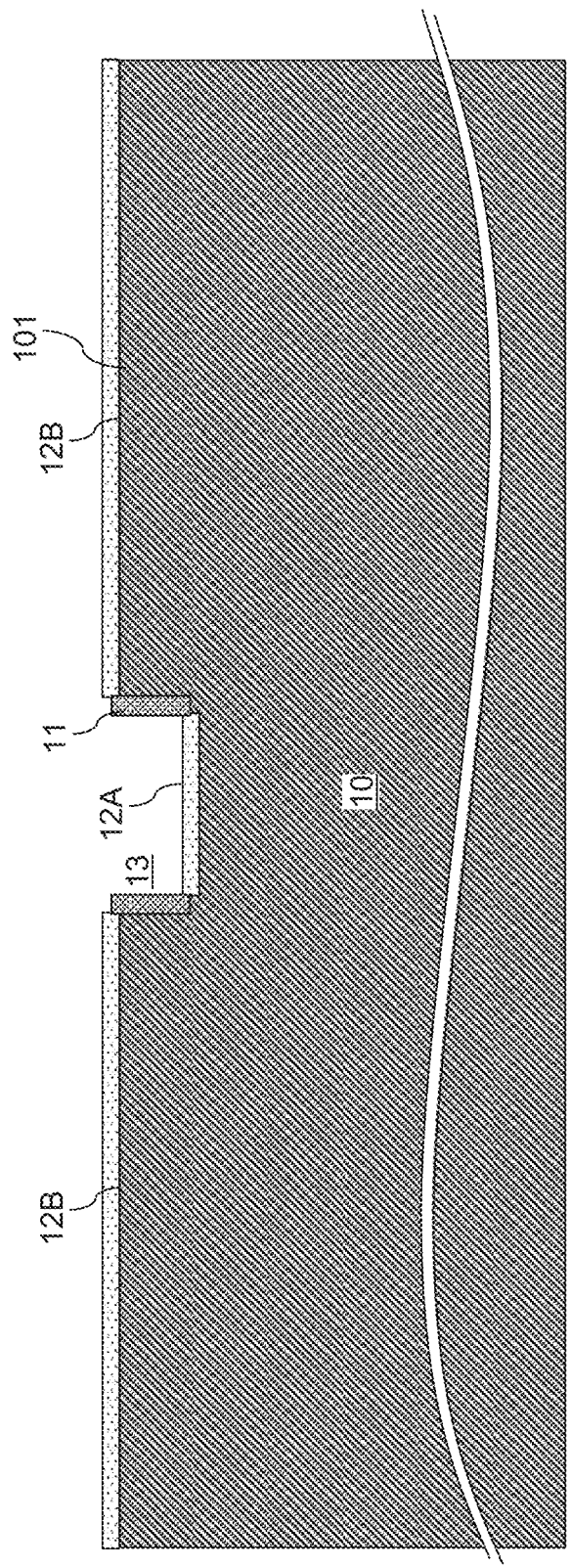
FIG. 3 is a vertical cross-sectional view of the exemplary structure after formation of semiconductor oxide plates according to an embodiment of the present disclosure.

Referring to FIG. 3, an oxidation process may be performed to convert physically exposed surface portions of the semiconductor matrix material layer 10 at the bottom of the recess cavity 13 and on un-recessed portions of the semiconductor matrix material layer 10 into semiconductor oxide plates (12A, 12B). For example, a thermal oxidation process may be performed to convert physically exposed surface portions of the semiconductor matrix material layer 10 into semiconductor oxide material portions. The diffusion barrier spacer 11 prevents diffusion of oxygen atoms therethrough to the semiconductor matrix material layer 10 forming the sidewalls of the recessed cavity 13 during the oxidation process. The thermal oxidation process may employ a dry oxidation process, a wet oxidation process, or a rapid thermal oxidation process. For example, dry oxidation is a thermal oxidation process employing $O_2$ as an oxidant. Wet oxidation is a thermal oxidation employing $H_2O$ as an oxidant. Rapid thermal oxidation is a thermal oxidation process that employs a single wafer processing chamber and provides thermal oxidation at a high temperature.

A first semiconductor oxide plate 12A may be formed at the bottom of the recess cavity 13 by conversion of the underlying surface portion of the semiconductor matrix material layer 10 into a dielectric semiconductor oxide material portion. A second semiconductor oxide plate 12B may be formed on the first horizontal surface 101 of the un-recessed portion of the semiconductor matrix material layer 10 by conversion of the underlying surface portion of the semiconductor matrix material layer 10 into an additional dielectric semiconductor oxide material portion. The thickness of the first and second semiconductor oxide plates (12A, 12B) may be in a range from 50 nm to 500 nm, although lesser and greater thicknesses may also be used. In one embodiment, the first and second semiconductor oxide plates (12A, 12B) may comprise, and/or may consist essentially of, silicon oxide or an oxide of the semiconductor material of the semiconductor matrix material layer 10 in case the semiconductor matrix material layer 10 includes any material other than silicon (such as a silicon-germanium alloy or a III-V compound semiconductor material)

Figure 4:
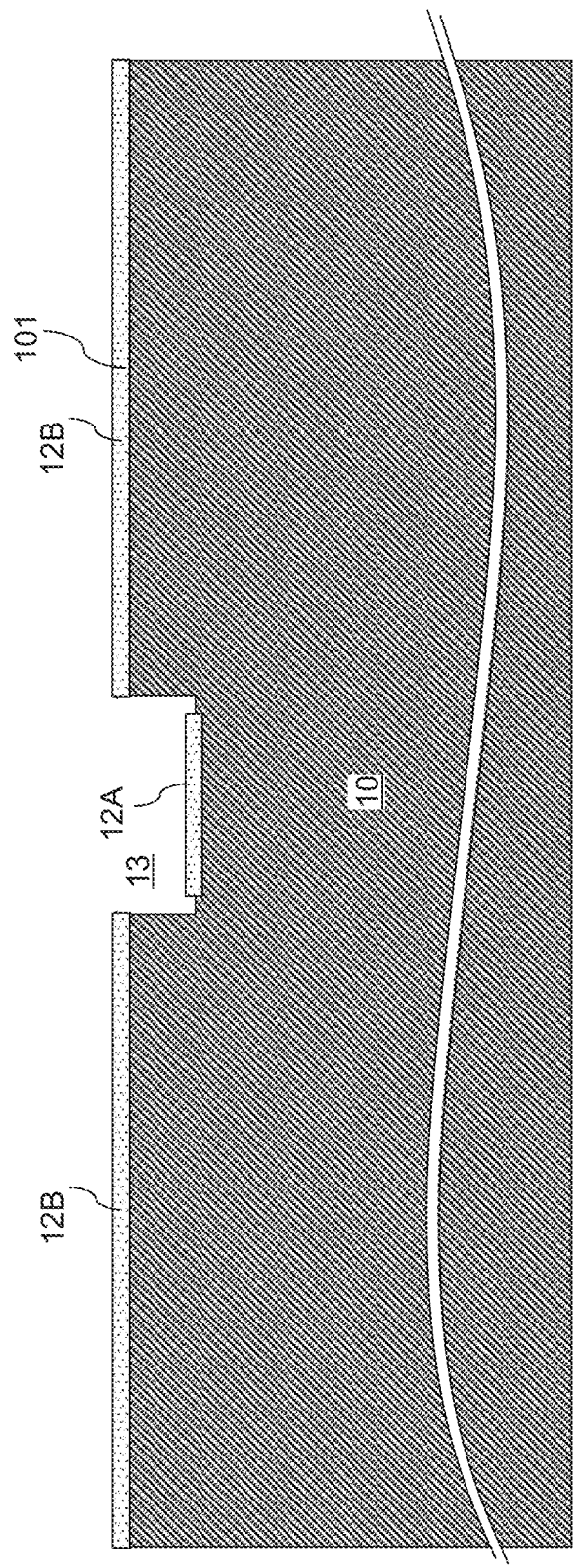
FIG. 4 is a vertical cross-sectional view of the exemplary structure after removal of the diffusion barrier spacer according to an embodiment of the present disclosure.

Referring to FIG. 4, the diffusion barrier spacer 11 may be removed selective to the materials of the first and second semiconductor oxide plates (12A, 12B) and the semiconductor matrix material layer 10. For example, if the diffusion barrier spacer 11 includes silicon nitride, a wet etch process using hot phosphoric acid may be performed to remove the diffusion barrier spacer 11 selective to the materials of the first and second semiconductor oxide plates (12A, 12B) and the semiconductor matrix material layer 10. Semiconductor surfaces of the semiconductor matrix material layer 10 may be physically exposed at the sidewalls of the recess cavity 13.

Figure 5A:
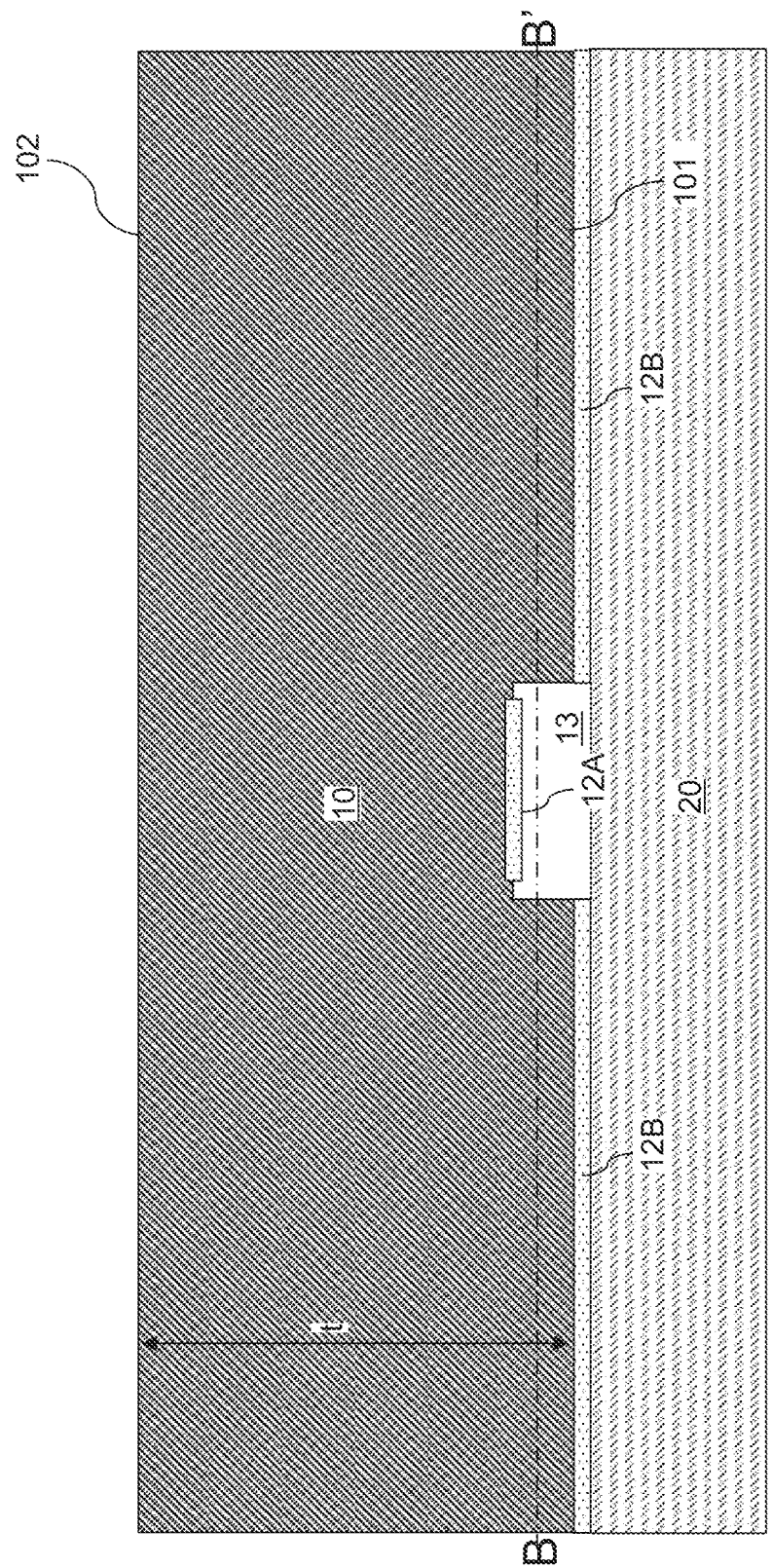
FIG. 5A is a vertical cross-sectional view of the exemplary structure after bonding the semiconductor matrix material layer to a handle substrate according to an embodiment of the present disclosure.

Referring to FIGS. 5A and 5B, the semiconductor matrix material layer 10 may be bonded to a handle substrate 20 via the second semiconductor oxide plate 12B. The handle substrate 20 may comprise a semiconductor substrate, a conductive substrate, a dielectric substrate, or a combination thereof. The handle substrate 20 may have a sufficient thickness to provide structural support during subsequent thinning of the semiconductor matrix material layer 10. For example, the thickness of the handle substrate 20 may be in a range from 60 microns to 1 mm.

A horizontal top surface of the handle substrate 20 includes a material that may be bonded to the semiconductor oxide material of the second semiconductor oxide plate 12B. The second semiconductor oxide plate 12B may be attached to the handle substrate 20 by bonding the second semiconductor oxide plate 12B to the handle substrate 20. A suitable bonding method may be used to bond the second semiconductor oxide plate 12B to the horizontal top surface of the handle substrate 20. For example, if the handle substrate 20 comprises a semiconductor top surface, semiconductor-to-oxide bonding such as silicon-to-silicon oxide bonding may be used to bond the handle substrate 20 to the second semiconductor oxide plate 12B. Alternatively, if the handle substrate 20 comprises a semiconductor oxide top surface (such as a silicon oxide top surface), oxide-to-oxide bonding such as silicon oxide-to-silicon oxide bonding may be used to bond the handle substrate 20 to the second semiconductor oxide plate 12B. Semiconductor-to-oxide bonding or oxide-to-oxide bonding may be performed by an anneal process at an elevated temperature, which may be in a range from 200 degrees Celsius to 600 degrees Celsius.

The semiconductor matrix material layer 10 may be subsequently thinned by grinding, polishing, and/or etching the backside surface of the semiconductor matrix material layer 10 located on the opposite side of the second semiconductor oxide plate 12B. A terminal step of the thinning process may include a polishing step that provides a horizontal planar surface on the backside (i.e., the polished side) of the semiconductor matrix material layer 10. The polished backside surface of the semiconductor matrix material layer 10 is herein referred to as a second horizontal surface 102. The thickness t of the semiconductor matrix material layer 10 as measured between the second horizontal surface 102 and the first horizontal surface 101 that contacts the second semiconductor oxide plate 12B may be in a range from 2 microns to 60 microns, such as from 4 microns to 30 microns, although lesser and greater thicknesses may also be used. The lower limit for the thickness t of the semiconductor matrix material layer 10 may be imposed by the minimum capacitance requirement for the capacitor structure to be subsequently formed, and the upper limit for the thickness t of the semiconductor matrix material layer 10 may be imposed by the process capability and economic viability of an etch process that is subsequently used to form comb trenches through the semiconductor matrix material layer 10.

Figure 6A:
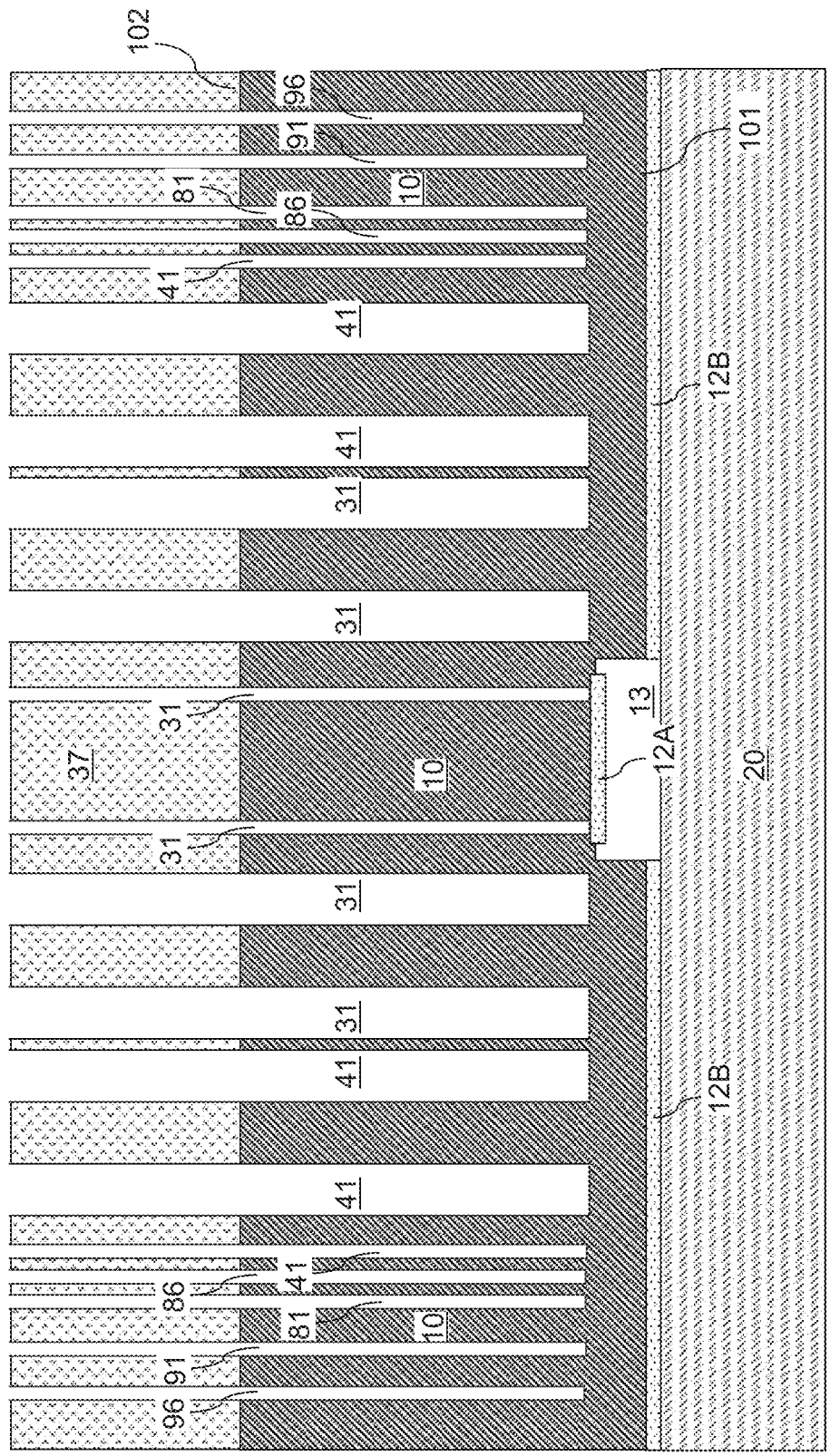
FIG. 6A is a vertical cross-sectional view of the exemplary structure after formation of comb trenches and moat trenches according to an embodiment of the present disclosure.
Figure 6B:
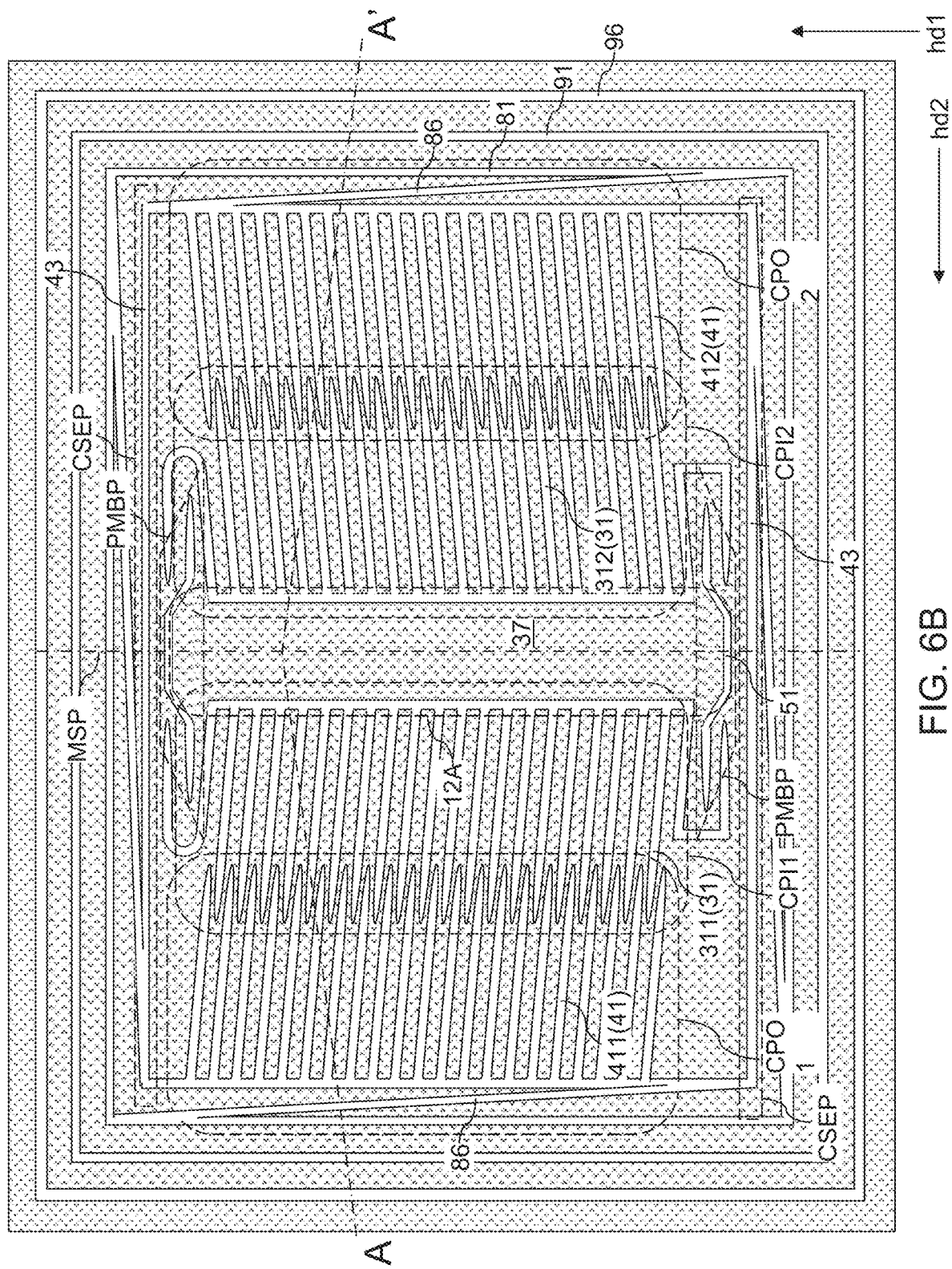
FIG. 6B is a horizontal cross-sectional view of the exemplary structure along the plane B-B' of FIG. 6A. The hinged vertical plane A-A' is the plane of the vertical cross-sectional view of FIG. 6A.

Referring to FIGS. 6A and 6B, a photoresist layer 37 may be applied over the second horizontal surface 102 of the semiconductor matrix material layer 10, and may be lithographically patterned to form openings therethrough. The pattern of the openings in the photoresist layer 37 may include two interdigitated comb patterns. Each interdigitated comb pattern may include an inner comb pattern (CPI1 or CPI2) and an outer comb pattern (CPO1 or CPO2). A first interdigitated comb pattern (CPI1, CPO1) includes a first inner comb pattern CPI1 and a first outer comb pattern CPO1. A second interdigitated comb pattern (CPI2, CPO2) includes a second inner comb pattern CII2 and a second outer comb pattern CPO2.

Each inner comb pattern (CPI1 or CPI2) includes a respective comb shaft pattern and a respective comb teeth pattern that may be adjoined to the respective comb shaft pattern. Each comb shaft pattern of the inner comb patterns (CPI1, CPI2) may laterally extend along a first horizontal direction hd1 with, or without, a lateral undulation. Each outer comb pattern (CPO1 or CPO2) includes a respective comb shaft pattern and a respective comb teeth pattern that may be adjoined to the respective comb shaft pattern. Each comb shaft pattern of the outer comb patterns (CPO1, CPO2) may laterally extend along the first horizontal direction hd1 with, or without, a lateral undulation. The comb shaft patterns within the outer comb patterns (CPO1, CPO2) may be adjoined to comb shaft extension patterns CSEP that laterally extend along a second horizontal direction hd2 that is perpendicular to the first horizontal direction hd1. Specifically, end segments of each of the comb shaft patterns within the outer comb patterns (CPO1, CPO2) may be adjoined to end segments of the comb shaft extension patterns CSEP such that the set of the comb shaft patterns within the outer comb patterns (CPO1, CPO2) and the comb shaft extension patterns CSEP collectively form a generally rectangular shape, which defines an outer boundary of a cavity to be subsequently formed in the semiconductor matrix material layer 10.

The two interdigitated comb patterns may be arranged such that the two inner comb patterns (CPI1, CPI2) are proximal to each other and the two outer comb patterns (CPO1, CPO2) are distal from each other. In other words, the lateral separation distance between the comb shaft patterns of the two outer comb patterns (CPO1, CPO2) along the second horizontal direction hd2 is greater than the lateral separation distance between the comb shaft patterns of the two inner comb patterns (CPI1, CPI2).

An elongated region that is masked by the photoresist layer 37 may be provided between the comb shaft patterns of the two inner comb patterns (CPI1, CPI2), which includes an area of in which a proof mass (i.e., a center mass portion) is to be subsequently patterned from the semiconductor matrix material layer 10. The openings in the photoresist layer 37 may include proof mass barrier patterns PMBP, which are located at a boundary of the area in which the proof mass is to be subsequently formed. The comb shaft patterns of the two inner comb patterns (CPI1, CPI2) may have extension portions that wraps around the proof mass barrier patterns PMBP to provide an etchant constriction structure that impedes lateral etching of portions of the semiconductor matrix material layer 10 around the proof mass barrier patterns PMBP.

Each comb teeth pattern within the inner comb patterns (CPI1, CIP2) and the outer comb patterns (CPO1, CPO2) includes a plurality of comb tooth patterns that are parallel to one another. Each comb tooth pattern laterally extends away from a respective comb shaft pattern along a common lengthwise direction of the comb tooth patterns. Each tooth pattern may be elongated along a lengthwise direction and may have a stem region having a substantially uniform width and attached to a respective comb shaft pattern. Each tooth pattern may also have a pointed end segment having a width that gradually decreases with a distance from the respective comb shaft pattern. The common lengthwise direction of the comb tooth patterns within a comb teeth pattern may be at an angle in a range from 1 degree to 10 degrees, such as from 2 degrees to 8 degrees, with respective to the second horizontal direction hd2 in order to optimize change in the capacitance in a capacitor structure to be subsequently formed as a function of displacement of a movable structure to be subsequently formed. The pointed end segment of each comb tooth pattern may be advantageously used to increase the change in capacitance during displacement of the movable structure (i.e., center mass portion) to be subsequently formed.

The comb tooth patterns of the first inner comb pattern CPI1 and the comb tooth patterns of the first outer comb pattern CPO1 may be interdigitated with parallel lengthwise directions for all comb tooth patterns therein. The interdigitated region may include pointed end segments of the first inner comb pattern CPI1 and the comb tooth patterns of the first outer comb pattern CPO1. Likewise, comb tooth patterns of the second inner comb pattern CPI2 and the comb tooth patterns of the second outer comb pattern CPO2 may be interdigitated with parallel lengthwise directions for all comb tooth patterns therein. The interdigitated region may include pointed end segments of the second inner comb pattern CPI2 and the comb tooth patterns of the second outer comb pattern CPO2. The lengthwise directions of the comb tooth patterns of the second inner comb pattern CPI2 and the comb tooth patterns of the second outer comb pattern CPO2 may be tilted in an opposite direction from the second horizontal direction hd2 with respect to the lengthwise direction of the comb tooth patterns of the first inner comb pattern CPI1 and the comb tooth patterns of the first outer comb pattern CPO1. The overall pattern of the openings in the photoresist layer 37 may have a mirror symmetry plane (MSP) that extends along the first horizontal direction hd1.

In one embodiment, the area in which the proof mass is to be subsequently formed and the area of portions of the comb shaft patterns of the two inner comb patterns (CPI1, CPI2) that extend along the first horizontal direction hd1 may be located between a pair of lengthwise sidewalls of the first semiconductor oxide plate 12A in a top-down view. While the present disclosure is described using an embodiment that describes an accelerometer, and patterns of the openings in the photoresist layer 37 are optimized for forming an accelerometer, methods of the present disclosure may be used to form any microstructure including a movable structure including a proof mass (i.e., a movable center mass). As such, the design of the openings in the photoresist layer 37 may, or may not, be symmetric. Further, while two sets of interdigitated patterns are used to describe the present disclosure, a single interdigitated pattern or three or more interdigitated patterns may be used to form a single interdigitated combed structure or three or more interdigitated combed structures for a microstructure, which may be a MEMS device. Generally, the proof mass may be formed within the area defined by the periphery of the first semiconductor oxide plate 12A.

Further, the pattern in the photoresist layer 37 may include patterns of moat trenches that laterally surround the areas of the comb tooth patterns of the first inner comb pattern CPI1 and the comb tooth patterns of the first outer comb pattern CPO1. For example, the pattern of the moat trenches may include a pattern for a proximal moat trench that laterally surrounds the patterns of moat trenches that laterally surround the areas of the comb tooth patterns of the first inner comb pattern CPI1 and the comb tooth patterns of the first outer comb pattern CPO1; a pattern for an intermediate moat trench that laterally surrounds the pattern for the proximal moat trench; a pattern for a distal moat trench that laterally surrounds the pattern for the intermediate moat trench, and a pattern for suspension spring moat trenches connecting a respective pair of a segment of the pattern for proximal moat trench and a pattern of a comb shaft portion.

An anisotropic etch process may be performed to transfer the pattern of the openings in the photoresist layer 37 through an upper portion of the semiconductor matrix material layer 10. The anisotropic etch process may be a reactive ion etch process that etches unmasked portions of the matrix semiconductor material layer 10, and thus, replicates the pattern of the openings in the photoresist layer in the upper portion of the semiconductor matrix material layer 10. Comb trenches (31, 41, 51) are formed through the upper portion of the semiconductor matrix material layer 10. Each of the comb trenches extends from the second horizontal surface 102 of the semiconductor matrix material layer 10 toward the first horizontal surface 101 of the semiconductor matrix material layer 10. In one embodiment, the comb trenches (31, 41, 51) vertically extend to the horizontal plane including the top surface of the first semiconductor oxide plate 12A, i.e., the horizontal plane including the horizontal interface between the first semiconductor oxide plate 12A and the semiconductor matrix material layer 10. The anisotropic etch process may have an etch chemistry for etching the semiconductor material of the semiconductor matrix material layer 10 selective to the material of the first semiconductor oxide plate 12A. For example, the anisotropic etch process may have an etch chemistry that uses $HBr/NF_3/O_2/SF_6$.

Two interdigitated comb trenches may be formed, which replicate the pattern of the two interdigitated comb patterns. Each interdigitated comb trench may include an inner comb trench 31 and an outer comb trench 41. A first interdigitated comb trench includes a first inner comb trench 311 and a first outer comb trench 411 located on one side of the mirror symmetry plane (MSP). A second interdigitated comb trench includes a second inner comb trench 312 and a second outer comb trench 412 located on the opposite side of the mirror symmetry plane (MSP).

Each inner comb trench 31 includes a respective comb trench shaft portion that replicates a comb shaft pattern and a respective comb trench teeth portion that replicates a comb teeth pattern and is adjoined to the respective comb trench shaft portion. Each comb trench shaft portion of the inner comb trenches 31 may laterally extend along the first horizontal direction hd1 with, or without, a lateral undulation. Each outer comb trench 41 includes a respective comb trench shaft portion that replicated a comb shaft pattern and a respective comb trench teeth portion that replicates a comb teeth pattern and is adjoined to the respective comb trench shaft portion. Each comb trench shaft portion of the outer comb trenches 41 may laterally extend along the first horizontal direction hd1 with, or without, a lateral undulation. The comb trench shaft portions within the outer comb trenches 41 may be adjoined to comb trench extension portions 43 that laterally extend along the second horizontal direction hd2. Specifically, end segments of each of the comb trench shaft portions within the outer comb trenches 41 may be adjoined to end segments of the comb trench extension portions 43 such that the set of the comb trench shaft portions within the outer comb trenches 41 and the comb trench extension portions 43 collectively form a generally rectangular shape, which defines an outer boundary of a cavity to be subsequently formed in the semiconductor matrix material layer 10.

The two interdigitated comb trenches (31, 41) may be arranged such that the two inner comb trenches (311, 312)

are proximal to each other and the two outer comb trenches (411, 412) are distal from each other. In other words, the lateral separation distance between the comb trench shaft portions of the two outer comb trenches (411, 412) along the second horizontal direction hd2 is greater than the lateral separation distance between the comb trench shaft portions of the two inner comb trenches (311, 312).

A first portion of the semiconductor matrix material layer 10 having a generally elongated rectangular shape may be provided between the comb trench shaft portions of the two inner comb trenches (311, 312), which corresponds to a region from which a proof mass (i.e., a center mass portion) is to be subsequently patterned. Proof mass barrier trenches 51 may be formed underneath the openings in the photoresist layer 37 that include the proof mass barrier patterns (PMBP), which are located at a boundary of the area in which the proof mass is to be subsequently formed. A pair of proof mass barrier trenches 51 may be laterally spaced apart along the first horizontal direction hd1. The comb trench shaft portions of the two inner comb trenches (311, 312) may have extension portions that wraps around the proof mass barrier trenches 51, and may be subsequently used to form a structure that constricts lateral etching of the semiconductor matrix material layer 10 during a subsequent isotropic etch process.

Each comb trench teeth portion within the inner comb trenches 31 and the outer comb trenches 41 may include a plurality of comb trench tooth portions that are parallel to one another. Each comb trench tooth portion laterally extends away from a respective comb trench shaft portion along a common lengthwise direction of the comb trench tooth portions. Each comb trench tooth portion may be elongated along a lengthwise direction and may have a stem region having a substantially uniform width and attached to a respective comb trench shaft portion, and may have a pointed end segment having a width that gradually decreases with a distance from the respective comb trench shaft portion. The common lengthwise direction of the comb trench tooth portions within a comb trench teeth portion may be at an angle in a range from 1 degree to 10 degrees, such as from 2 degrees to 8 degrees. The pointed end segment of each comb trench tooth portion may be advantageously used to increase the change in capacitance during displacement of the movable structure to be subsequently formed.

The comb trench tooth portions of the first inner comb trench 311 and the comb trench tooth portions of the first outer comb trench 411 may be interdigitated with parallel lengthwise directions for all comb trench tooth portions therein. The interdigitated region may include pointed end segments of the first inner comb trench 311 and the comb trench tooth portions of the first outer comb trench 411. Likewise, comb trench tooth portions of the second inner comb trench 312 and the comb trench tooth portions of the second outer comb trench 412 may be interdigitated with parallel lengthwise directions for all comb trench tooth portions therein. The interdigitated region may include pointed end segments of the second inner comb trench 312 and the comb trench tooth portions of the second outer comb trench 412. The lengthwise directions of the comb trench tooth portions of the second inner comb trench 312 and the comb trench tooth portions of the second outer comb trench 412 may be tilted in an opposite direction from the second horizontal direction hd2 with respect to the lengthwise direction of the comb trench tooth portions of the first inner comb trench 311 and the comb trench tooth portions of the first outer comb trench 411. The overall pattern of the comb trenches (31, 41, 51) may have a mirror symmetry plane (MSP) that extends along the first horizontal direction hd1.

In one embodiment, the area in which the proof mass is to be subsequently formed and the area of portions of the comb trench shaft portions of the two inner comb trenches (311, 312) that laterally extend along the first horizontal direction hd1 may be located between a pair of lengthwise sidewalls of the first semiconductor oxide plate 12A in a top-down view. The photoresist layer 37 may be subsequently removed, for example, by ashing.

Moat trenches (81, 91, 96, 86) may laterally surround the areas of the inner comb trenches 31 and the outer comb trenches 41. For example, the moat trenches (81, 91, 96, 86) may include a proximal moat trench 81 that laterally surrounds the inner comb trenches 31 and the outer comb trenches 41; an intermediate moat trench 91 that laterally surrounds the proximal moat trench 81; a distal moat trench 96 that laterally surrounds the intermediate moat trench 91, and suspension spring moat trenches 86 connecting a respective pair of a segment of the proximal moat trench 81 and a comb trench shaft portion of the two outer comb trenches (411, 412).

Figure 7A:
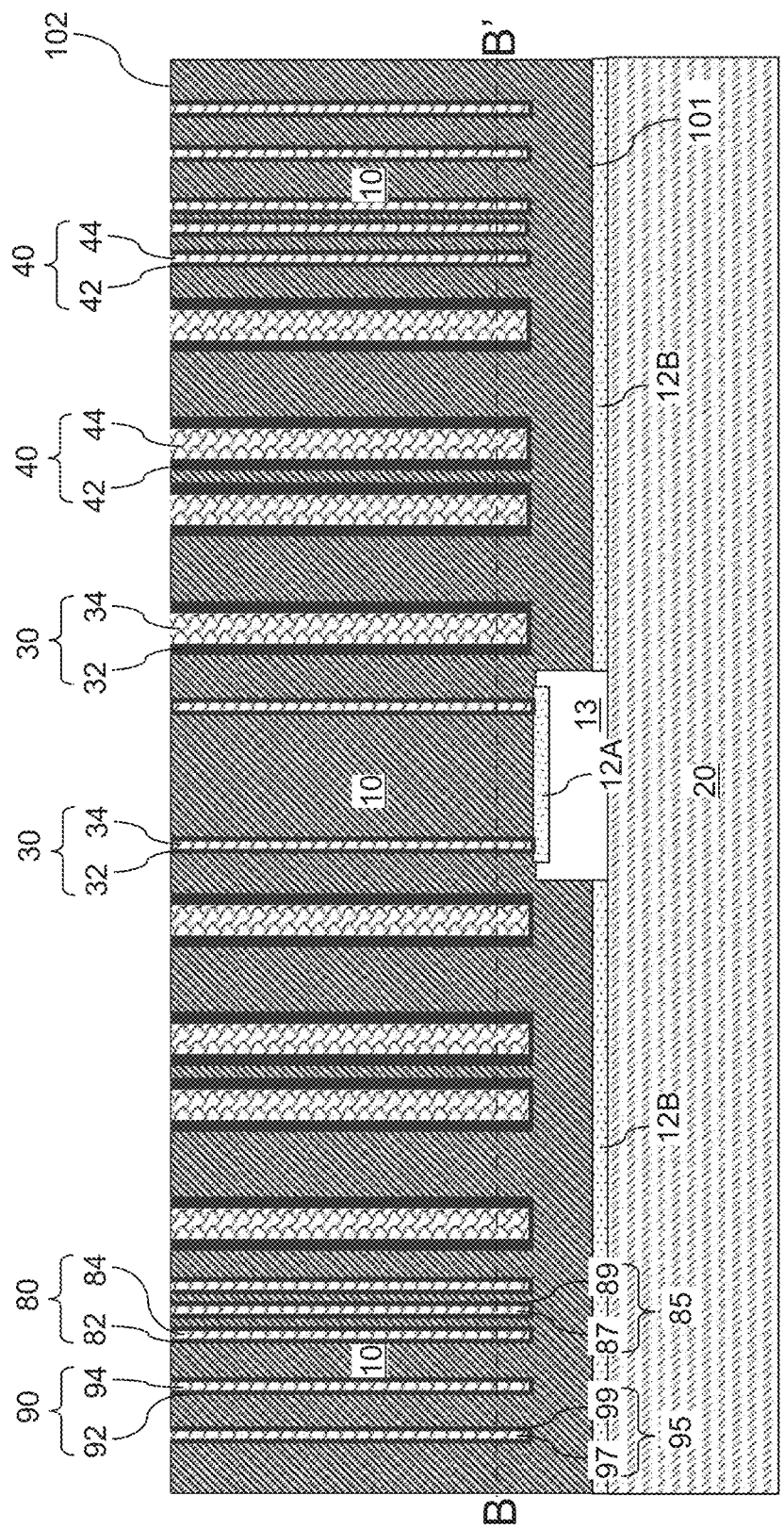
FIG. 7A is a vertical cross-sectional view of the exemplary structure after formation of comb structures and wall structures according to an embodiment of the present disclosure.
Figure 7B:
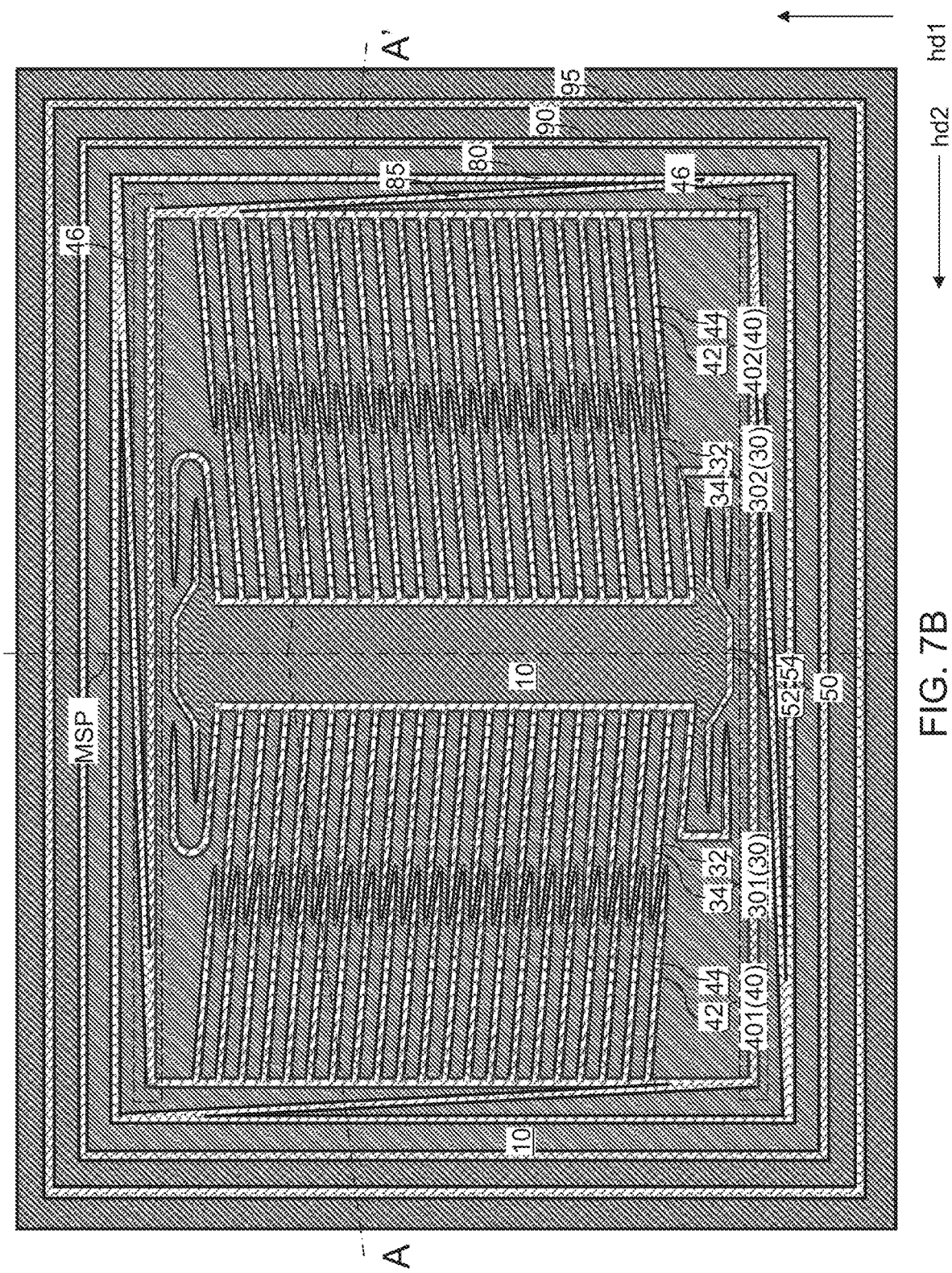
FIG. 7B is a horizontal cross-sectional view of the exemplary structure along the plane B-B' of FIG. 7A. The hinged vertical plane A-A' is the plane of the vertical cross-sectional view of FIG. 7A.

Referring to FIGS. 7A and 7B, a dielectric liner layer may be conformally formed on physically exposed surfaces of the semiconductor matrix material layer 10 in the comb trenches (31, 41, 51), in the moat trenches (81, 91, 96, 86), and over the second horizontal surface 102 of the semiconductor matrix material layer 10. In one embodiment, the dielectric liner layer may be formed by an oxidation process that converts physically exposed surface portions of the semiconductor matrix material layer 10 into a semiconductor oxide liner such as silicon oxide liner. Alternatively, the dielectric liner layer may be formed by conformally depositing a dielectric material such as silicon oxide, silicon nitride, a dielectric metal oxide (such as aluminum oxide and/or hafnium oxide). The thickness of the dielectric liner layer may be in a range from 4 nm to 100 nm, such as from 6 nm to 20 nm. Generally, the thickness of the dielectric liner layer may be optimized to maximize the capacitive coupling between comb structures to be subsequently formed, and to minimize leakage current through the dielectric liner layer.

Subsequently, a conductive material may be deposited in remaining volumes of the comb trenches (31, 41, 51) and the moat trenches (81, 91, 96, 86), and over the horizontally-extending portion of the dielectric liner layer that overlies the second horizontal surface 102 of the semiconductor matrix material layer 10. The conductive material may include a doped semiconductor material or a metallic material. For example, the conductive material may include heavily doped polysilicon, which may be p-doped or n-doped. The conductive material may fill the remaining volumes of the comb trenches (31, 41, 51) and the moat trenches (81, 91, 96, 86).

Excess portions of the conductive material and the horizontally-extending portion of the dielectric liner layer located above the horizontal plane including the second horizontal surface 102 of the semiconductor matrix material layer 10 may be removed using a planarization process. The planarization process may use chemical mechanical planarization (CMP) and/or a recess etch process. In embodiments in which a recess etch process is used, the horizontally-extending portion of the dielectric liner layer may be used as an endpoint detection layer for a recess etch step that removes the conductive material overlying the horizontally-extending portion of the dielectric liner. Subsequently, the horizontally-extending portion of the dielectric liner may be removed by an isotropic etch step such as a wet etch step using dilute hydrofluoric acid. In embodiments in which chemical mechanical planarization (CMP) process is used, the horizontally-extending portion of the dielectric liner may be used as a planarization stopping layer during polishing of the conductive material overlying the horizontally-extending portion of the dielectric liner. Subsequently, the horizontally-extending portion of the dielectric liner may be removed by an isotropic etch step such as a wet etch step using dilute hydrofluoric acid.

Remaining portions of the dielectric liner layer comprise dielectric liners (32, 42, 52, 82, 92, 87, 97). The dielectric liners (32, 42, 52, 82, 92, 87, 97) include inner dielectric liners 32 that are formed within a respective one of the inner comb trenches 31, outer dielectric liners 42 that are formed within a respective one of the outer comb trenches 41, barrier dielectric liners 52 that are formed within a respective one of the proof mass barrier trenches 51, and moat trench dielectric liners (82, 92, 87, 97). Remaining portions of the conductive fill material comprise conductive fill material portions (34, 44, 54, 84, 94, 89, 99). The conductive fill material portions (34, 44, 54, 94, 94, 89, 99) include inner conductive fill material portions 34 that may be formed within a respective one of the inner comb trenches 31, outer conductive fill material portions 44 that are formed within a respective one of the outer comb trenches 41, barrier conductive fill material portions 54 that are formed within a respective one of the proof mass barrier trenches 51, and moat trench fill material portions (84, 94, 89, 99) that are formed within a respective one of the moat trenches (81, 91, 86, 96).

Combinations of a remaining portion of the dielectric liner layer and a remaining portion of the conductive material comprise comb structures (30, 40). Specifically, each combination of an inner dielectric liner 32 and an inner conductive fill material portion 34 comprise an inner comb structure 30, and each combination of an outer dielectric liner 42 and an outer conductive fill material portion 44 comprise an outer comb structure 40. A first interdigitated comb structure (301, 401) including a first inner comb structure 301 and a first outer comb structure 401 may be formed on one side of the mirror symmetry plane (MSP), and a second interdigitated comb structure (302, 402) including a second inner comb structure 302 and a second outer comb structure 402 may be formed on the opposite side of the mirror symmetry plane MSP. A barrier structure 50 including a barrier dielectric liner 52 and a barrier conductive fill material portion 54 may be formed in each proof mass barrier trench 51.

The moat trench dielectric liners (82, 92, 87, 97) may include an inner dielectric liner 82 that may be formed in the proximal moat trench 81, an intermediate dielectric liner 92 that may be formed in the intermediate moat trench 91, an outer dielectric liner 97 that may be formed in the distal moat trench 96, and suspension spring dielectric liners 87 that may be formed in the suspension spring moat trenches 86. The moat trench fill material portions (84, 94, 89, 99) may include a proximal fill material portion 84 that may be formed in the proximal moat trench 81, an intermediate fill material portion 94 that may be formed in the intermediate moat trench 91, a distal fill material portion 99 that may be formed in the distal moat trench 96, and suspension spring fill material portions 89 that may be formed in the suspension spring moat trenches 86.

The combination of inner dielectric liner 82 and the proximal fill material portion 84 constitutes a proximal wall structure 80. The combination of the intermediate dielectric liner 92 and the intermediate fill material portion 94 constitutes an intermediate wall structure 90. The combination of the outer dielectric liner 97 and the distal fill material portion 99 constitutes a distal wall structure 95. Each combination of a suspension spring dielectric liner 87 and a suspension spring fill material portion 89 constitutes a suspension wall structure 85.

Generally, each of the comb structures (30, 40) may comprise a respective dielectric liner (32 or 42) and a respective conductive fill material portion (34 or 44). Each of the comb structures (30, 40) extends from a second horizontal surface 102 of the semiconductor matrix material layer 10 toward the first horizontal surface 101 of the semiconductor matrix material layer 10 located at an interface with the second semiconductor oxide plate 12B. Each dielectric liner (32, 42) may be a patterned portion of the dielectric liner layer, and each conductive fill material portion (34, 44) may be a remaining portion of the conductive fill material. In one embodiment, the comb structures (30, 30) comprise a pair of inner comb structures (301, 302) that may be laterally spaced apart by a first portion of the semiconductor matrix material layer 10 and a pair of outer comb structures (401, 402) that are interdigitated with the pair of inner comb structures (301, 302). Comb shaft portions of the outer comb structures (401, 402) extend along the first horizontal direction hd1 and then along the second horizontal direction hd2 to be adjoined to one another, thereby defining a substantially rectangular area that is entirely laterally enclosed by the combined comb shaft portions of the outer comb structures (401, 402). In other words, the comb shaft portions of the outer comb structures (401, 402) may constitute a frame that laterally encloses all teeth portions of the outer comb structures (401, 402) and the entirety of the inner comb structures (301, 302).

Two interdigitated comb structures (30, 40) may be formed, which have horizontal cross-sectional shapes that replicate the pattern of the two interdigitated comb patterns. Each interdigitated comb structure (30, 40) may include an inner comb structure 30 and an outer comb structure 40. A first interdigitated comb structure includes a first inner comb structure 301 and a first outer comb structure 401 located on one side of the mirror symmetry plane (MSP). A second interdigitated comb structure includes a second inner comb structure 302 and a second outer comb structure 402 located on the opposite side of the mirror symmetry plane (MSP).

Each inner comb structure 30 includes a respective comb structure shaft portion that replicates a comb shaft pattern and a respective comb structure teeth portion that replicates a comb teeth pattern and is adjoined to the respective comb structure shaft portion. Each comb structure shaft portion of the inner comb structures 30 may laterally extend along the first horizontal direction hd1 with, or without, a lateral undulation. Each outer comb structure 40 includes a respective comb structure shaft portion that replicated a comb shaft pattern and a respective comb structure teeth portion that replicates a comb teeth pattern and is adjoined to the respective comb structure shaft portion. Each comb structure shaft portion of the outer comb structures 40 may laterally extend along the first horizontal direction hd1 with, or without, a lateral undulation. The comb structure shaft portions within the outer comb structures 40 may be adjoined to comb structure extension portions 46 that laterally extend along the second horizontal direction hd2. Specifically, end segments of each of the comb structure shaft portions within the outer comb structures 40 may be adjoined to end segments of the comb structure extension portions 46 such that the set of the comb structure shaft portions within the outer comb structures 40 and the comb structure extension portions 46 collectively form a generally rectangular shape, which defines an outer boundary of a cavity to be subsequently formed in the semiconductor matrix material layer 10.

The two interdigitated comb structures (30, 40) may be arranged such that the two inner comb structures (301, 302) are proximal to each other and the two outer comb structures (401, 402) are distal from each other. In other words, the lateral separation distance between the comb structure shaft portions of the two outer comb structures (401, 402) along the second horizontal direction hd2 is greater than the lateral separation distance between the comb structure shaft portions of the two inner comb structures (301, 302).

A first portion of the semiconductor matrix material layer 10 having a generally elongated rectangular shape may be provided between the comb structure shaft portions of the two inner comb structures (301, 302), which corresponds to a region from which a proof mass (i.e., a center mass portion) may be subsequently patterned. Barrier structures 50 may be formed in the proof mass barrier trenches 51. A pair of barrier structures 50 may be laterally spaced apart along the first horizontal direction hd1. The comb structure shaft portions of the two inner comb structures (301, 302) may have extension portions that wraps around the barrier structures 52, and are subsequently used to form a structure that constricts lateral etching of the semiconductor matrix material layer 10 during a subsequent isotropic etch process.

Each comb structure teeth portion within the inner comb structures 30 and the outer comb structures 40 includes a plurality of comb structure tooth portions that may be parallel to one another. Each comb structure tooth portion laterally extends away from a respective comb structure shaft portion along a common lengthwise direction of the comb structure tooth portions. Each comb structure tooth portion may be elongated along a lengthwise direction and may have a stem region having a substantially uniform width and attached to a respective comb structure shaft portion, and may have a pointed end segment having a width that gradually decreases with a distance from the respective comb structure shaft portion. The common lengthwise direction of the comb structure tooth portions within a comb structure teeth portion may be at an angle in a range from 1 degree to 10 degrees, such as from 2 degrees to 8 degrees. The pointed end segment of each comb structure tooth portion may be advantageously used to increase the change in capacitance during displacement of the movable structure to be subsequently formed.

The comb structure tooth portions of the first inner comb structure 301 and the comb structure tooth portions of the first outer comb structure 401 may be interdigitated with parallel lengthwise directions for all comb structure tooth portions therein. The interdigitated region may include pointed end segments of the first inner comb structure 301 and the comb structure tooth portions of the first outer comb structure 401. Likewise, comb structure tooth portions of the second inner comb structure 302 and the comb structure tooth portions of the second outer comb structure 402 may be interdigitated with parallel lengthwise directions for all comb structure tooth portions therein. The interdigitated region may include pointed end segments of the second inner comb structure 302 and the comb structure tooth portions of the second outer comb structure 402. The lengthwise directions of the comb structure tooth portions of the second inner comb structure 302 and the comb structure tooth portions of the second outer comb structure 402 may be tilted in an opposite direction from the second horizontal direction hd2 with respective to the lengthwise direction of the comb structure tooth portions of the first inner comb structure 301 and the comb structure tooth portions of the first outer comb structure 401. The overall pattern of the comb structures (30, 40) and the barrier structures 50 may have a mirror symmetry plane (MSP) that extends along the first horizontal direction hd1.

Figure 8A:
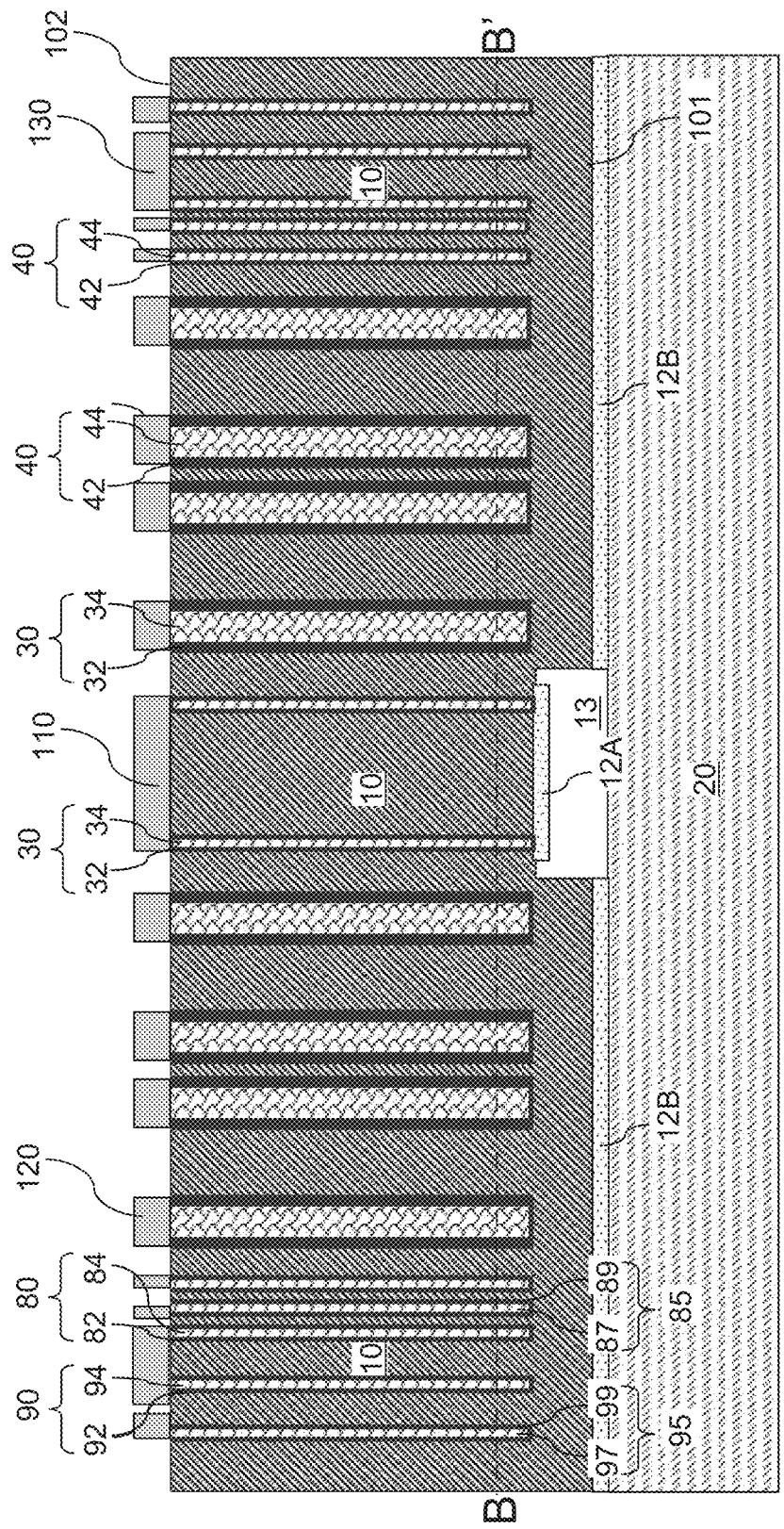
FIG. 8A is a vertical cross-sectional view of the exemplary structure after formation of metallic material portions according to an embodiment of the present disclosure.
Figure 8B:
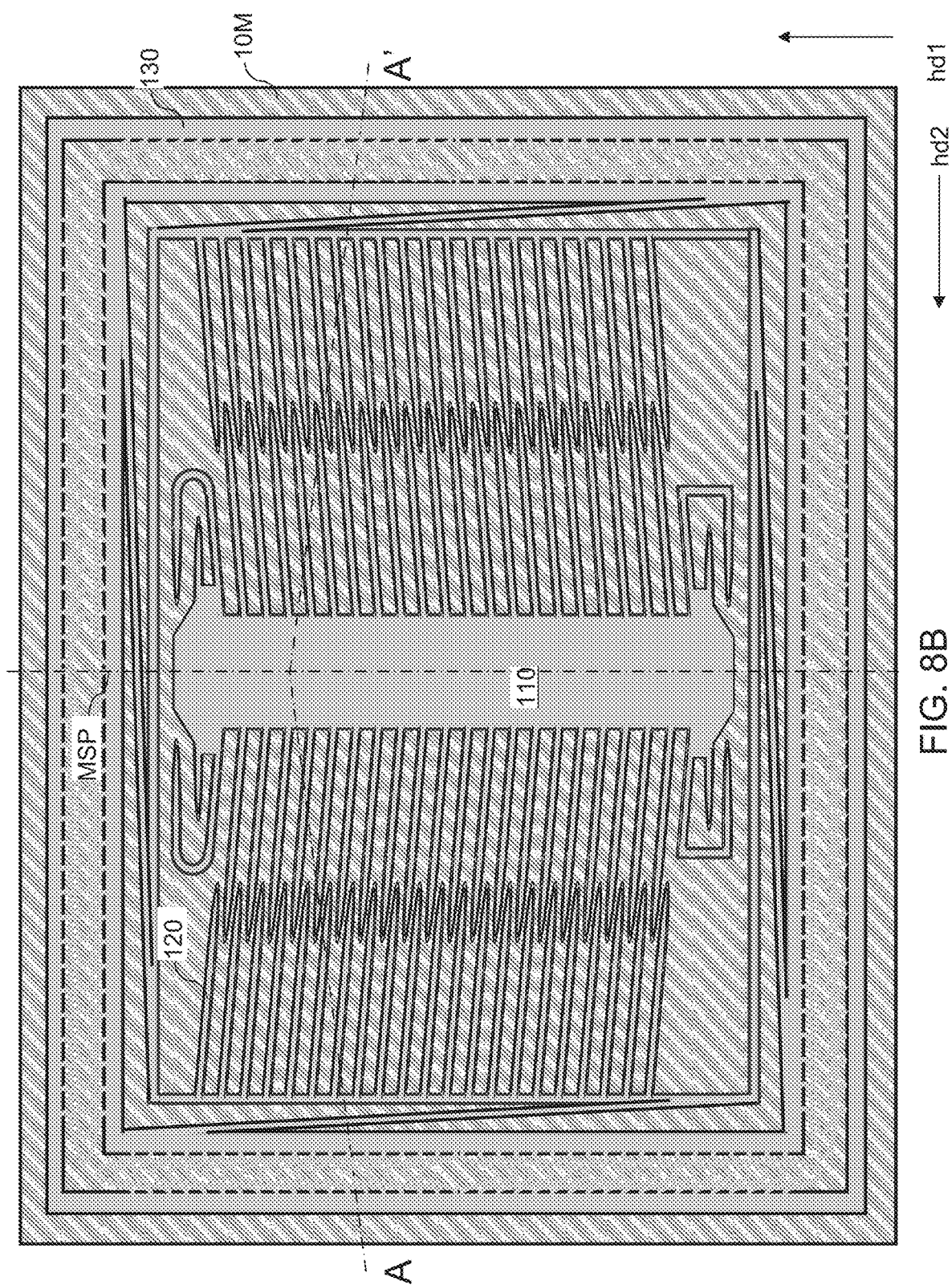
FIG. 8B is a top-down view of the exemplary structure along the plane B-B' of FIG. 11A. The hinged vertical plane A-A' is the plane of the vertical cross-sectional view of FIG. 11A.

Referring to FIGS. 8A and 8B, metallic material portions (110, 120, 130) may be formed the second horizontal surface 102 of the semiconductor matrix material layer 10 and over the comb structures (30, 40). For example, a patterned deposition mask (not shown), such as a patterned photoresist layer, may be formed over the exemplary structure, and at least one metallic material may be deposited by physical vapor deposition. The at least one metallic material may include, for example, a metallic liner material (such as TiN, TaN, or WN) and an underbump metallurgy material such as Ni, Cr, Cu, and stacks thereof. The thickness of the at least one metallic material may be in a range from 100 nm to 2,000 nm, although lesser and greater thicknesses may also be used. The patterned deposition mask and portions of the at least one metallic material overlying the patterned deposition mask may be removed, for example, by a lift-off process.

Remaining portions of the at least one metallic material located deposited on the inner comb structures 30 comprises a movable metallic plate 110. Remaining portions of the at least one metallic material deposited on the outer comb structures 40 comprises stationary metallic plates 120. Remaining portions of the at least one metallic material deposited on the semiconductor matrix material layer 10 comprises a spring structure 130, which may include openings between an inner frame of the spring structure 130 and an outer frame of the spring structure 130. The spring structure 130 may have a suitable pattern to provide application of electrical bias voltages to opposing portions of the stationary comb structures 40.

Figure 9A:
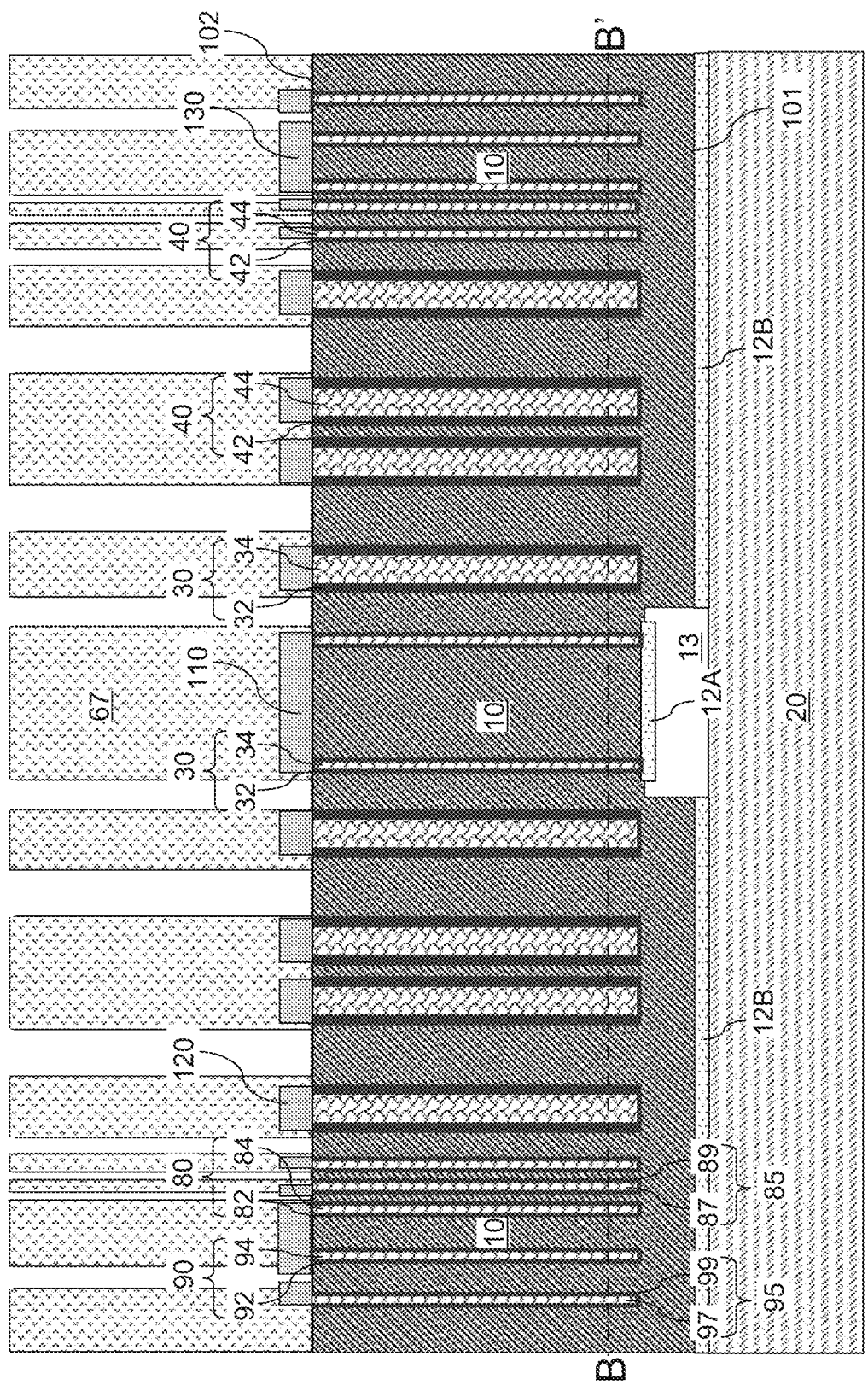
FIG. 9A is a vertical cross-sectional view of the exemplary structure after formation of a patterned etch mask layer according to an embodiment of the present disclosure.
Figure 9B:
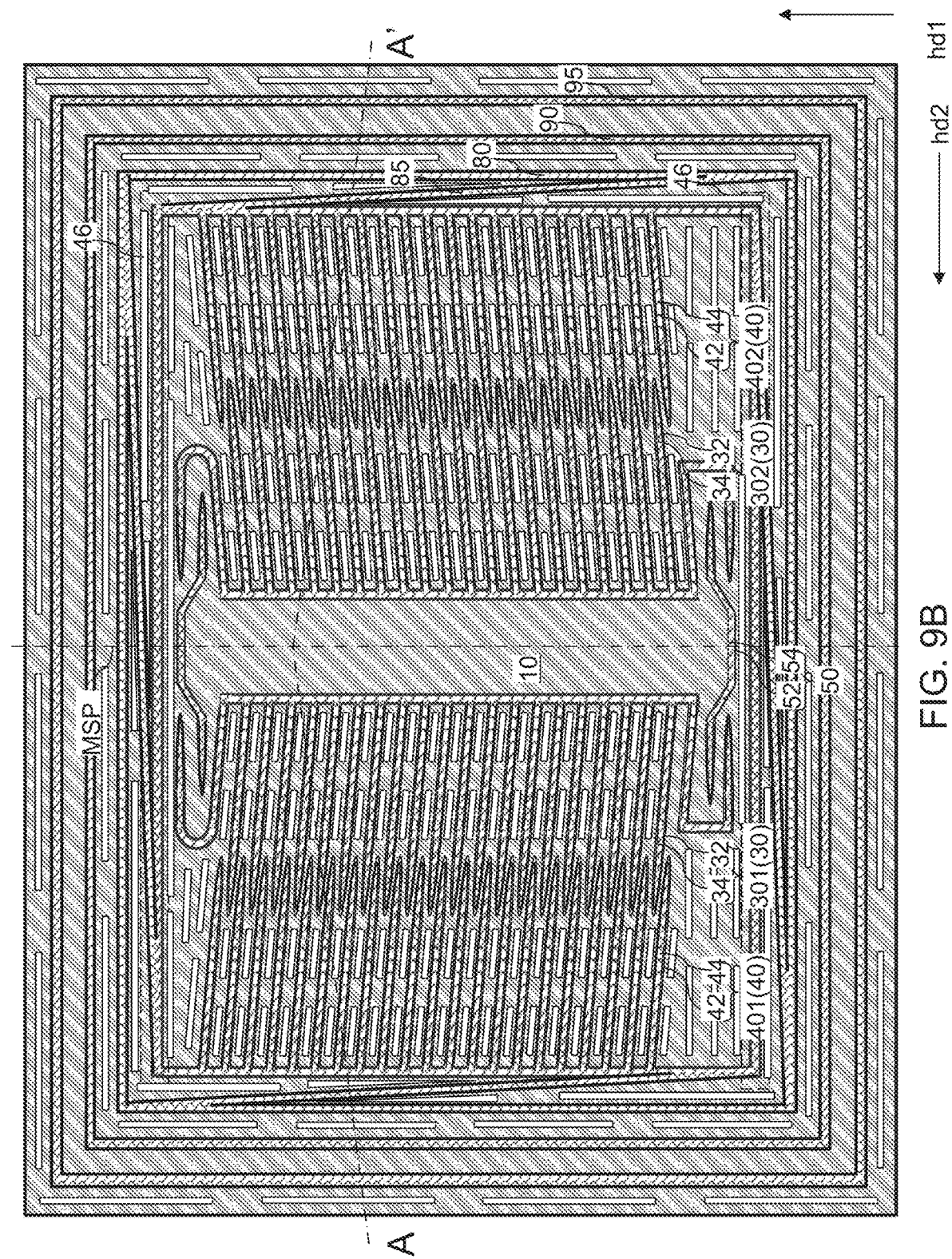
FIG. 9B is a partial see-through top-down view of the exemplary structure of FIG. 9A. The hinged vertical plane A-A' is the plane of the vertical cross-sectional view of FIG. 9A.

Referring to FIGS. 9A and 9B, an etch mask material layer 67 may be applied over various metallic material portions (110, 120, 130), and may be lithographically patterned to form openings therethrough. The etch mask material layer 67 may include a photoresist material, or may include a hard mask material such as silicon nitride, silicon oxide, or a dielectric metal oxide. The etch mask material layer 67 may be patterned either directly (if the etch mask material layer 67 includes a photoresist material), or may be patterned by applying and patterning a photoresist layer thereabove and by transferring the pattern in the photoresist layer into the etch mask material layer using an anisotropic etch process.

The pattern of the openings in the patterned etch mask layer 67 may be selected such that a subset of the openings in the patterned etch mask layer 67 is formed within a boundary defined by the comb shaft portion of the outer comb structures 40 and the comb structure extension portions 46. Further, the pattern of the openings in the patterned etch mask layer 67 do not overlap with areas of the comb structures (30, 40), the comb structure extension portions 46, the barrier structures 50, or a portion of the semiconductor matrix material layer 10 located between the intermediate wall structure 90 and the distal wall structure 95. The openings in the patterned etch mask layer 67 are located within areas in which the metallic material portions (110, 120, 130) are not present. A subset of the openings in the patterned etch mask layer 67 may overlie the areas of gaps between neighboring pairs of comb structure tooth portions. A subset of the openings in the patterned etch mask layer 67 may be formed between the barrier structures 50 and the comb structure extension portions 46. Openings in the patterned etch mask layer 67 are not present within the first portion of the semiconductor matrix material layer 10 located between a pair of comb structure shaft portions of the inner comb structures 30 and lateral extensions thereof, and located between a pair of barrier structures 50. A subset of the openings in the patterned etch mask layer 67 may be formed between the proximal wall structure 80 and the comb structure extension portions 46.

Figure 10A:
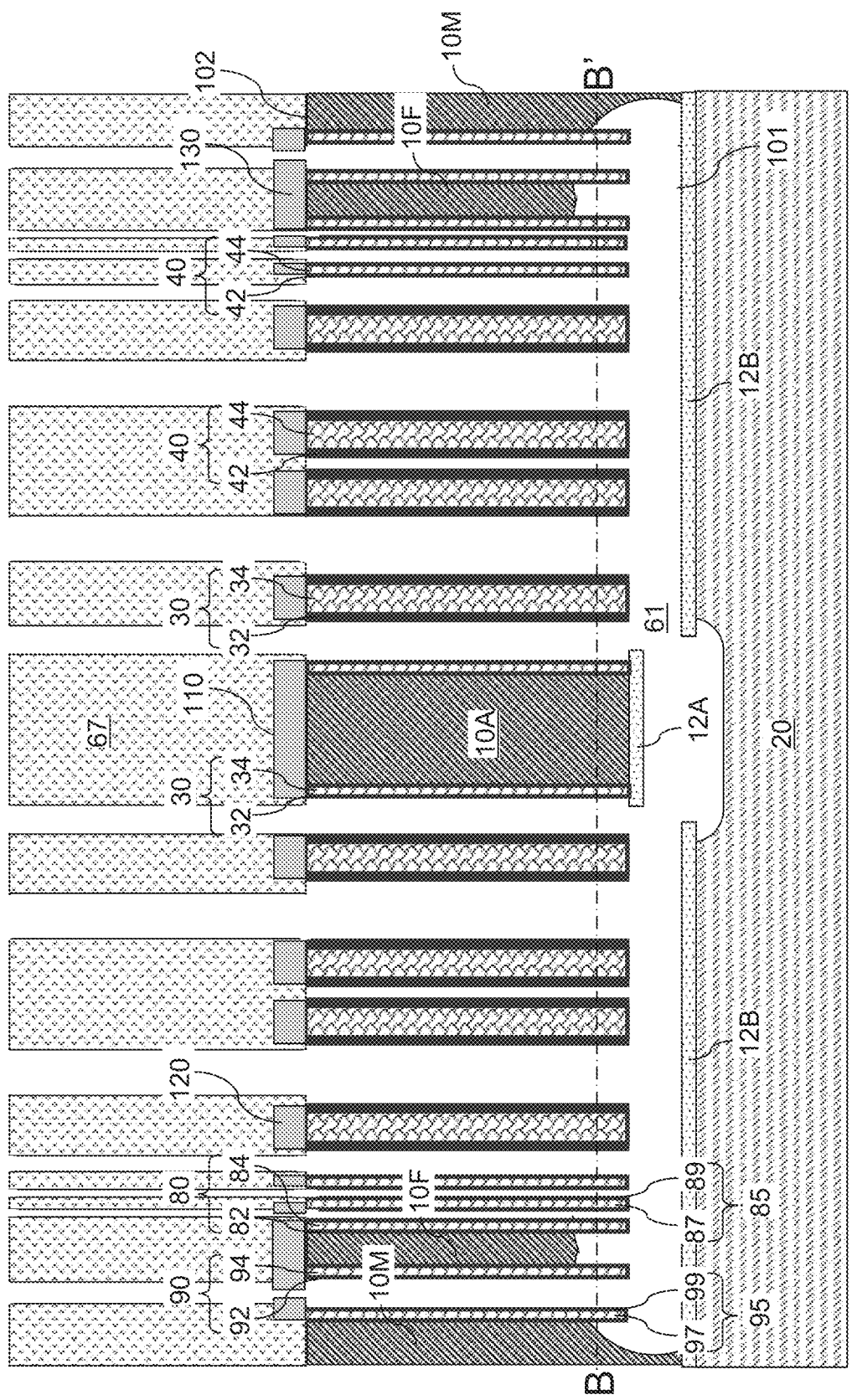
FIG. 10A is a vertical cross-sectional view of the exemplary structure after isotropically etching unmasked portions of the semiconductor matrix material layer selective to the patterned etch mask layer, the comb structures, the moat-trench fill structures, and the semiconductor oxide plates according to an embodiment of the present disclosure.
Figure 10B:
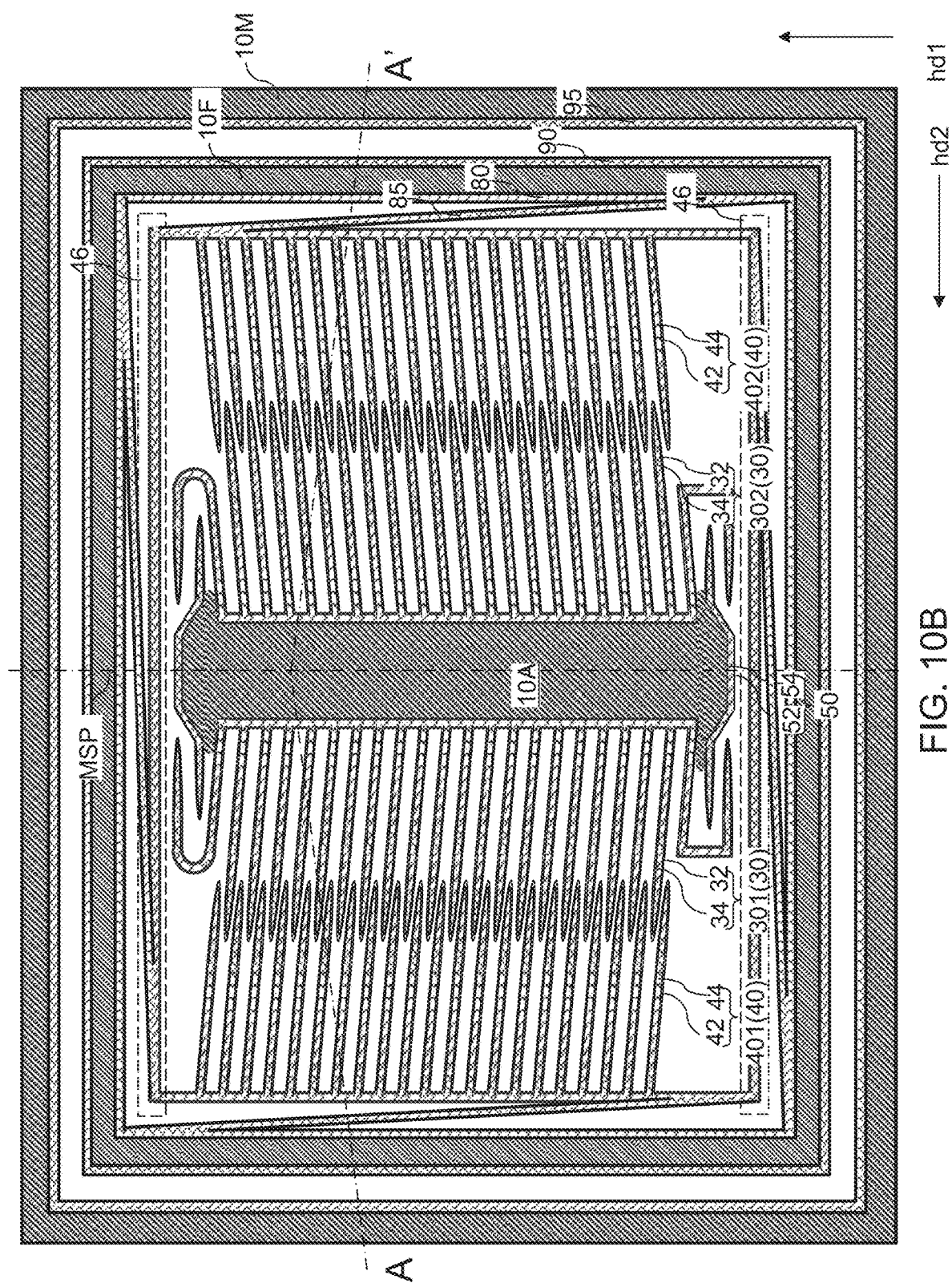
FIG. 10B is a horizontal cross-sectional view of the exemplary structure along the plane B-B' of FIG. 9A. The hinged vertical plane A-A' is the plane of the vertical cross-sectional view of FIG. 9A.

Referring to FIGS. 10A and 10B, portions of the semiconductor matrix material layer 10 that are not masked by the patterned etch mask layer 67 may be etched using a combination of an anisotropic etch process and an isotropic etch process, or using an isotropic etch process. In one embodiment, an anisotropic etch process may be formed to etch through the unmasked portions of the semiconductor matrix material layer 10. Deep trenches may be formed to the depth of the first semiconductor oxide plate 12A underneath the openings in the patterned etch mask layer 67.

Subsequently, an isotropic etch process using an isotropic etchant may be performed, which etches the semiconductor material of the semiconductor matrix material layer 10 selective to the dielectric materials of the first and second semiconductor oxide plates (12A, 12B) and the dielectric liners (32, 42, 52). A portion of the semiconductor matrix material layer 10 may be removed by the isotropic etch process. The removed portion of the semiconductor matrix material layer 10 include portions that are located within a lateral boundary defined by the comb structure shaft portions within the outer comb structures 40, the comb structure extension portions 46, and the inner wall structure 80 and located outside the comb structure shaft portions of the inner comb structures 30. The removed portion of the semiconductor matrix material layer 10 is herein referred to as a second portion of the semiconductor matrix material layer 10. Further, the portion of the semiconductor matrix material layer 10 located between the intermediate wall structure 90 and the distal wall structure 95 is removed. The unetched portion of the semiconductor matrix material layer 10 that remains after the isotropic etch process and located outside the distal wall structure 95 is herein referred to as a semiconductor matrix layer 10M. The unetched portion of the semiconductor matrix material layer 10 that remains after the isotropic etch process and located between the proximal wall structure 80 and the intermediate wall structure 85 is herein referred to as a semiconductor frame 10F.

The isotropic etch process may use a wet etch process that etches the semiconductor material of the semiconductor matrix material layer 10 selective to the materials of the first and second semiconductor oxide plates (12A, 12B) and the dielectric liners (32, 42, 52). In one embodiment, the wet etch process may use hot trimethyl-2 hydroxyethyl ammonium hydroxide ("hot TMY") or tetramethyl ammonium hydroxide (TMAH). The duration of the isotropic etch process may be selected such that the etch front of the isotropic etch process reaches the entire area of the portion of the top surface of the second semiconductor oxide plate 12B located within the area defined by the combination of the comb structure shaft portions within the outer comb structures 40, the comb structure extension portions 46, and the proximal wall structure 80. The comb structure extension portions 46 are attached to the semiconductor frame 10F through the spring wall structures 85 and the inner wall structure 80.

A movable structure including the inner comb structures 30, a first portion of the semiconductor matrix material layer 10 located between the inner comb structures 30 and remains unetched after the isotropic etch process, and a pair of barrier structures 50 that are attached to the first portion of the semiconductor matrix material layer 10 may be detached from a remaining unetched portion (which is herein referred to as a third portion) of the semiconductor matrix material layer 10 that remains outside the combination of the comb structure shaft portions within the outer comb structures 40, the comb structure extension portions 46, and the proximal wall structure 80. In one embodiment, a peripheral region of the first portion of the semiconductor matrix material layer 10 may be collaterally etched by the isotropic etchant as the isotropic etchant flows through a meandering channel defined by the extensions of the comb structure shaft portions of the inner comb structures 30 and the barrier structures 50.

The first portion of the semiconductor matrix material layer 10 comprises a proof mass of a movable structure, which is herein referred to as a center mass portion 10A. The third portion of the semiconductor matrix material layer 10 is herein referred to as a semiconductor matrix layer 10M. The first and second semiconductor oxide plates (12A, 12B) and the dielectric liners (32, 42, 52) function as etch barrier structures that define the extent of a cavity 61 that is formed upon removal of the second portion of the semiconductor matrix material layer 10. Inner sidewalls of the comb structure shaft portions within the outer comb structures 40, the comb structure extension portions 46, and the proximal wall structure 80 may function as an outer lateral boundary of the cavity 61. Sidewalls of the comb structure shaft portions of the inner comb structures 30 may function as an inner lateral boundary of the cavity 61, which encloses a first portion of the semiconductor matrix material layer 10 that is not etched by the isotropic etch process.

The volume of the recess cavity 13 may be incorporated into the cavity 61. In embodiments in which the handle substrate 20 includes a semiconductor material such as silicon, a surface of the handle substrate 20 that is not covered by the second semiconductor oxide plate 12B may be isotropically recessed to form a void, which is added to the cavity 61. The void may have an undercut underneath a periphery of the second semiconductor oxide plate 12B. The isotropic etchant may laterally etch the portion of the semiconductor matrix material layer 10 that underlies a boundary formed by the comb structure shaft portions within the outer comb structures 40, the comb structure extension portions 46, and the proximal wall structure 80, and undercut portions of the semiconductor matrix material layer 10 located outside the boundary.

In an alternative embodiment, the anisotropic etch process may be omitted, and the isotropic etch process may be elongated to etch through the second portion of the semiconductor matrix material layer 10 to form the cavity. In such embodiments, the duration of the isotropic etch process may be prolonged to ensure that the etch front of the isotropic etch process reaches the entire area of the portion of the top surface of the second semiconductor oxide plate 12B located within the area defined by the combination of the comb structure shaft portions within the outer comb structures 40, the comb structure extension portions 46, and the proximal wall structure 80.

Generally, the isotropic etchant of the isotropic etch process may be applied through the openings in the patterned etch mask layer 67. The isotropic etchant etches the semiconductor material of the semiconductor matrix material layer 10 selective to materials of the semiconductor oxide plates (12A, 12B) and selective to the material of the comb structures (30, 40) that contact the semiconductor matrix material layer 10, which may be the material of the dielectric liners (32, 42). The second portion of the semiconductor matrix material layer 10 that laterally surrounds the first portion of the semiconductor matrix material layer 10 may be removed selective to the comb structures (30, 40) using the isotropic etch process. The first portion of the semiconductor matrix material layer 10 may be protected from the etchant of the isotropic etch process by the first semiconductor oxide plate 12A, the pair of inner comb structures 30, and the patterned etch mask layer 67 located on the second horizontal surface 102 of the semiconductor matrix material layer 10 and covers the comb structures 30.

The portion of the patterned etch mask layer 67 covering the first portion of the semiconductor matrix material layer 10 protects the front side surface of the first portion of the semiconductor matrix material layer 10 during the isotropic etch process. The first semiconductor oxide plate 12A protects the backside of the first portion of the semiconductor matrix material layer 10 during the isotropic etch process. Thus, the center mass portion 10A, which is the first portion of the semiconductor matrix material layer 10 after the isotropic etch process, may have a uniform thickness between the first semiconductor oxide plate 12A and the interface with the patterned etch mask layer 67. In one embodiment, the center mass portion 10A may have a uniform thickness within an entire area that is laterally enclosed by the comb structure shaft portions of the inner comb structures 30 and the barrier structures 50.

The cavity 61 may be formed by the removal of the second portion of the semiconductor matrix material layer 10. The semiconductor matrix layer 10M, which includes the unetched third portion of the semiconductor matrix material layer 10, laterally surrounds the cavity 61. The movable structure (10A, 30, 50) including a combination of the first portion of the semiconductor matrix material layer 10 and the pair of inner comb structures 30 may be detached from the semiconductor matrix layer 10M by the isotropic etch process.

The inner comb structures 30 are components of the movable structure (10A, 30, 50), and are hereafter referred to as movable comb structures 30. The movable comb structures 30 include a first movable comb structure 301 and a second movable comb structure 302. The comb structure teeth portions of the inner comb structures 30 comprise movable comb fingers of the movable structure (10A, 30, 50).

The outer comb structures 40 are stationary components, and as such, are hereafter referred to as stationary comb structures 40. The stationary comb structures 40 include a first stationary comb structure 401 and a second stationary comb structure 402. The comb structure teeth portions of the stationary comb structures 40 comprise stationary comb fingers.

Figure 11A:
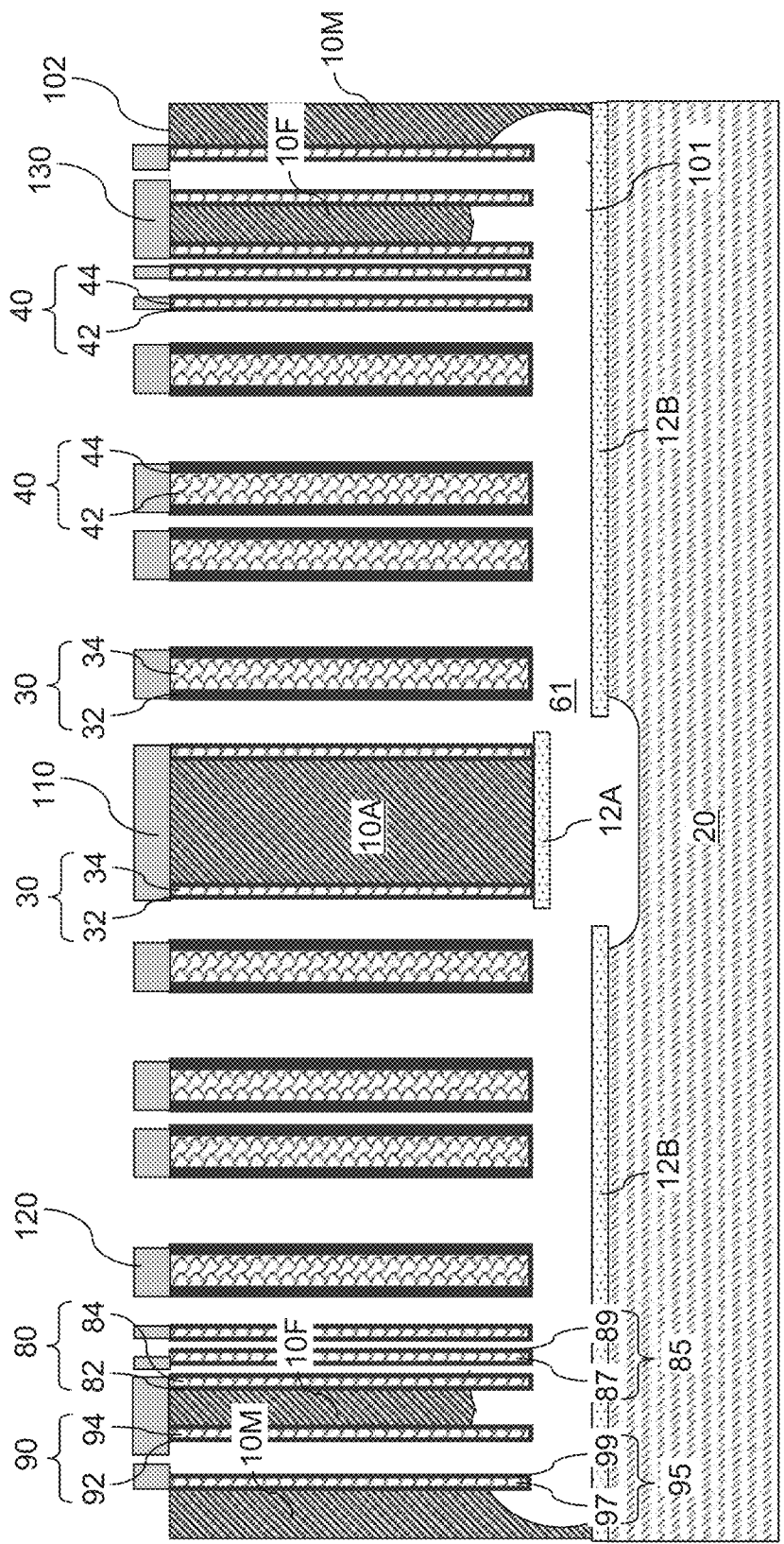
FIG. 11A is a vertical cross-sectional view of the exemplary structure after removal of the patterned etch mask layer according to an embodiment of the present disclosure.
Figure 11B:
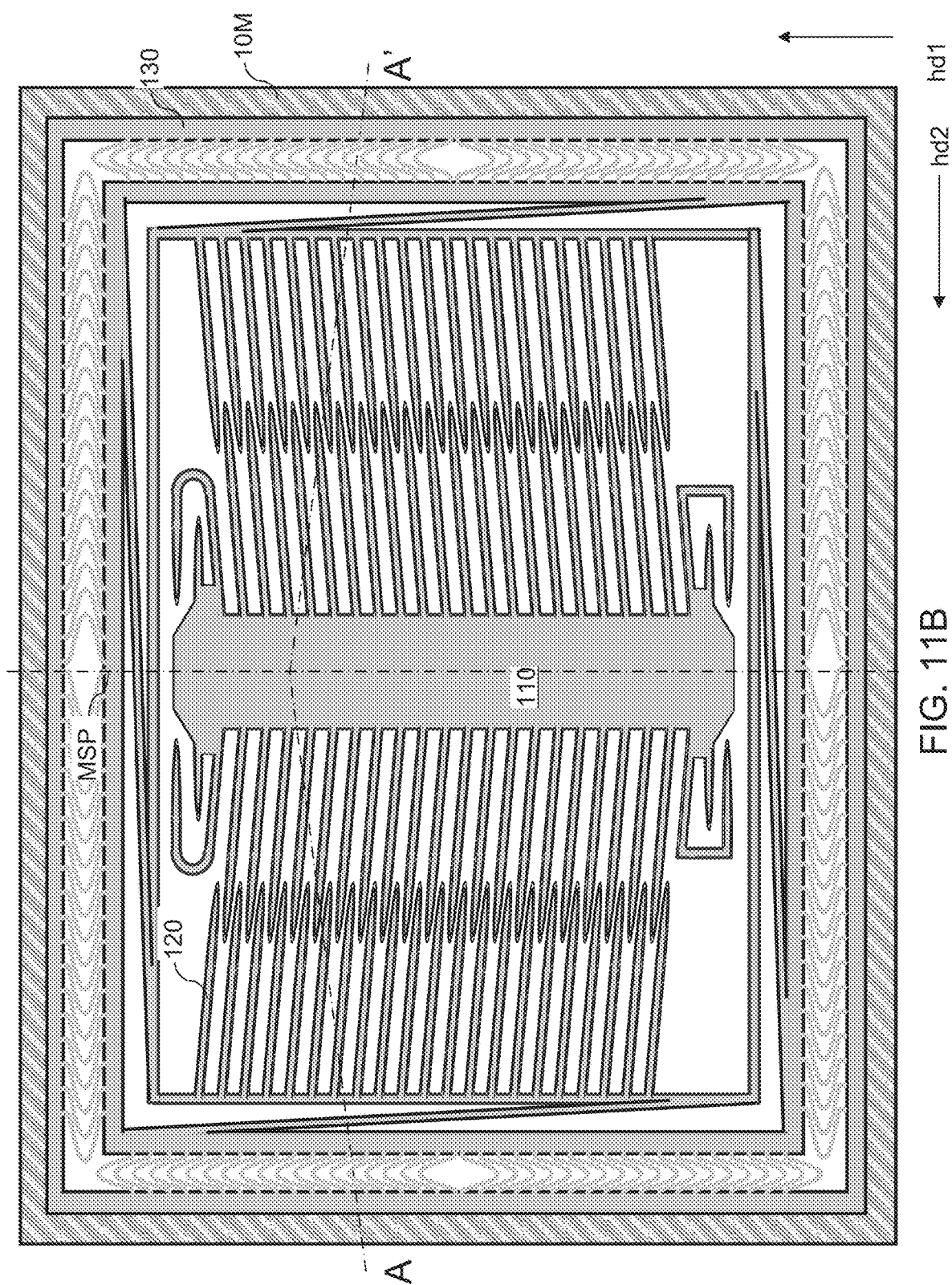
FIG. 11B is a top-down view of the exemplary structure along the plane B-B' of FIG. 11A. The hinged vertical plane A-A' is the plane of the vertical cross-sectional view of FIG. 11A.

Referring to FIGS. 11A and 11B, the patterned etch mask layer 67 may be removed, for example, by ashing. The metallic material portions (110, 120, 130) are located on the top surfaces of the movable structure (10A, 30, 50), the stationary comb structures 40, the semiconductor frame 10F, and the semiconductor matrix layer 10M. The metallic material portions (110, 120, 130) include a movable metallic plate 110 formed on the movable structure (10A, 30, 50), stationary metallic plates 120 formed on the stationary comb structures 40, and a spring structure 130 formed on the semiconductor frame 10F and the semiconductor matrix layer 10M and over the gap between the semiconductor frame 10F and the semiconductor matrix layer 10M. The spring structure 130 includes openings over the area of the gap in order to provide elasticity.

Figure 12:
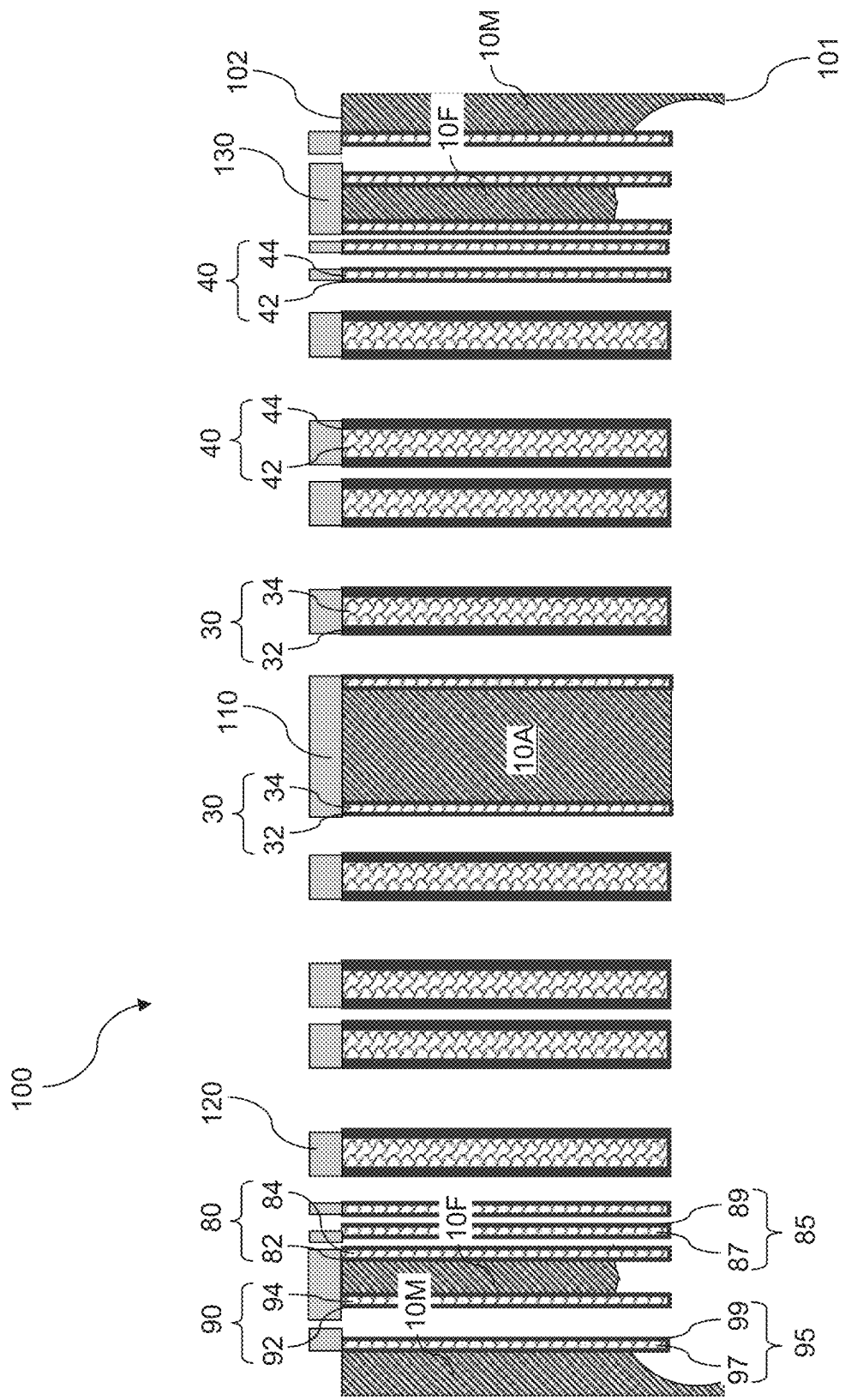
FIG. 12 is a vertical cross-sectional view of an accelerometer formed by detaching the handle substrate and singulating the exemplary structure into multiple accelerometers according to an embodiment of the present disclosure.

Referring to FIG. 12, each accelerometer 100 over the handle substrate 20 may be singulated, for example, by vacuum dicing. Subsequently, the handle substrate 20 may be detached, for example, by removing the semiconductor oxide plates (12A, 12B). For example, a wet etch using hydrofluoric acid may be performed to remove the semiconductor oxide plates (12A, 12B). Each accelerometer 100 can be electrically connected to a controller circuit or to a control unit employing routing wires, which may be attached to the spring structures 130 or to the stationary metallic plates 120. The control circuit or the control unit may be configured to measure acceleration based on a change in the capacitance of the capacitor structure within the accelerometer 100.

Referring to FIGS. 1A-12 collectively and according to various embodiments of the present disclosure, a microelectromechanical system (MEMS) device is provided, which comprises a movable structure (10A, 30, 50) located in a lateral confinement and comprising a center mass portion 10A and a first movable comb structure 301 including an inner comb shaft portion (i.e., the comb structure shaft portion of the first inner comb structure 301) attached to a first sidewall of the center mass portion 10A and first movable comb fingers (i.e., the comb structure teeth portion of the first inner comb structure 301) laterally protruding from the comb shaft portion. The center mass portion 10A comprises portion of a first semiconductor material. A semiconductor oxide plate (such as the first semiconductor oxide plate 12A) including an oxide of the first semiconductor material covers an entirety of a bottom surface of the center mass portion 10A. The first movable comb structure 301 comprises a dielectric liner (such as an inner dielectric liner 32) that is physically exposed to a cavity within the lateral confinement and a conductive fill material portion (such as an inner conductive fill material portion 34) located within the inner comb shaft portion and continuously extending into each of the first movable comb fingers and laterally enclosed by the dielectric liner 32.

In one embodiment, the movable structure (10A, 30, 50) comprises a second movable comb structure 302 including another inner comb shaft portion (i.e., the comb structure shaft portion of the second inner comb structure 302) attached to a second sidewall of the center mass portion 10A and second movable comb fingers (i.e., the comb structure teeth portion of the second inner comb structure 302) laterally protruding from the comb shaft portion. In one embodiment, the semiconductor oxide plate 12A has a greater width than a lateral spacing between the inner comb shaft portion and the outer comb shaft portion. In one embodiment, the semiconductor oxide plate 12A contacts a bottom surface of the inner comb shaft portion and a bottom surface of the outer comb shaft portion.

In one embodiment, the lateral confinement may be located within an opening in a semiconductor matrix layer 10M that comprises another portion of the first semiconductor material. In one embodiment, a first stationary comb structure 401 may be affixed to a first sidewall of the lateral confinement and may include first stationary comb fingers (i.e., the comb structure teeth portions of the first outer comb structure 401) that are interdigitated with the first movable comb fingers.

In one embodiment, the MEMS device of the present disclosure may comprise a MEMS accelerometer that is configured to detect displacement of the movable structure (10A, 30, 50) relative to the first stationary comb structure

401 by sensing a change in capacitance of a capacitor structure that includes the first movable comb structure 301 and the first stationary comb structure 401.

According to an aspect of the present disclosure, a micro-electromechanical system (MEMS) accelerometer is provided, which comprises a movable structure (10A, 30, 50) located in a lateral confinement. The movable structure (10A, 30, 50) may include a center mass portion 10A including a portion of a first semiconductor material, a first movable comb structure 301 affixed to a first side of the center mass portion 10A, and a second movable comb structure 302 affixed to a second side of the center mass portion 10A. Each of the first movable comb structure 301 and the second movable comb structure 302 comprises a respective comb shaft portion and a respective set of movable comb fingers (i.e., comb structure teeth portions) laterally protruding from the respective comb shaft portion. A first stationary comb structure 401 is affixed to a first sidewall of the lateral confinement and includes first stationary comb fingers (i.e., the comb structure teeth portions of the first outer comb structure 401) that are interdigitated with the first movable comb fingers. A second stationary comb structure 402 is affixed to a second sidewall of the lateral confinement and includes second stationary comb fingers (i.e., the comb structure teeth portions of the second outer comb structure 402) that are interdigitated with the second movable comb fingers. A semiconductor oxide plate (such as the first semiconductor oxide plate 12A) including an oxide of the first semiconductor material covers an entirety of a bottom surface of the center mass portion 10A.

In one embodiment, the first stationary comb structure 401 comprises an additional dielectric liner (such as an outer dielectric liner 42) that is physically exposed to the cavity within the lateral confinement and additional conductive fill material portions (such as an outer conductive fill material portion 44) located within a respective one of the first stationary comb fingers and laterally enclosed by the additional dielectric liner 42. In one embodiment, each of the first movable comb structure 301, the second movable comb structure 302, the first stationary comb structure 401, and the second stationary comb structure 402 comprises a respective dielectric liner (32, 42) that is physically exposed to a cavity within the lateral confinement and comprises a respective conductive fill material portion (34, 44). In one embodiment, the conductive fill material portions (34, 44) may have a different material composition than the first semiconductor material of the center mass portion 10A and the semiconductor matrix layer 10M.

In one embodiment, the first semiconductor oxide plate 12A may have a greater width than a lateral spacing between an interface between the center mass portion 10A and the first movable comb structure 301 and an interface between the center mass portion 10A and the second movable comb structure 302. In one embodiment, the first semiconductor oxide plate 12A may have a greater lateral extent along the second horizontal direction hd2 than the combination of the center mass portion 10A and the two comb structure shaft portions of the inner comb structures 30 (which excludes the comb structure teeth portions of the inner comb structures 30). In this embodiment, a planar top surface of a peripheral portion of the first semiconductor oxide plate 12A may be physically exposed to a cavity 61 between neighboring pairs of movable comb fingers within the first movable comb structure 301 and between neighboring pairs of movable comb fingers within the second movable comb structure 302.

In one embodiment, a top surface of the center mass portion 10A and a top surface of each conductive fill material portion (34, 44, 54) may be physically exposed to the cavity 61 within the lateral confinement. The entirety of the top surface of the center mass portion 10A (which faces the semiconductor die) may be located within a horizontal plane. The entirety of the bottom surface of the center mass portion 10A (which contacts the first semiconductor oxide plate 12A) may be located within another horizontal plane. In one embodiment, the thickness of the center mass portion 10A may be uniform.

In one embodiment, the MEMS device of the present disclosure may comprise a MEMS accelerometer. A combination of the movable structure (10A, 30, 50) and the semiconductor matrix layer 10M may be attached to a semiconductor structure (such as a semiconductor die) including a semiconductor substrate, field effect transistors (comprising a subset of the semiconductor devices) located on the semiconductor substrate, and metal interconnect structures formed within dielectric material layers. The field effect transistors may comprise a circuit configured to detect displacement of the movable structure (10A, 30, 50) relative to the pair of stationary comb structures 40 and the semiconductor matrix layer 10M by sensing a change in capacitance of a capacitor structure including the pair of movable comb structures 30 and the pair of stationary comb structures 40.

In one embodiment, the MEMS device of the present disclosure may comprise a capacitor structure including two subsets of the conductive fill material portions (such as the outer conductive fill material portions 44) of the first stationary comb structure 401 and/or the second stationary comb structure 402 as a first conductive node and a second conductive node. In one embodiment, a first conductive node of the capacitor structure may be formed by electrically connecting a first subset of the outer conductive fill material portions 44 located within the pair of outer comb structures (i.e., the stationary comb structures 40), and a second conductive node of the capacitor structure may be formed by electrically connecting a second subset of the outer conductive fill material portions 44 located within the pair of outer comb structures 40. In one embodiment, the outer conductive fill material portions 44 within the first subset and outer conductive fill material portions 44 within the second subset may alternate within each outer comb structure 40. In an illustrative example, the outer conductive fill material portions 44 within each of the outer comb structures (i.e., the stationary comb structures 40) may be numerically numbered sequentially with positive integers beginning with 1, and a set of odd-numbered outer conductive fill material portions 44 may be connected to the first conductive node of the capacitor structure, and a set of even-numbered outer conductive fill material portions 44 may be connected to the second conductive node of the capacitor structure.

According to another aspect of the present disclosure, a micro-electromechanical system (MEMS) accelerometer is provided, the MEMS device may include a movable structure (10A, 30, 50) located in a lateral confinement. The movable structure may include a center mass portion 10A including a portion of a first semiconductor material, a first movable comb structure 301 affixed to a first side of the center mass portion, and a second movable comb structure 302 affixed to a second side of the center mass portion 10A, wherein each of the first movable comb structure 301 and the second movable comb structure 302 comprises a respective comb shaft portion and a respective set of movable comb fingers laterally protruding from the respective comb shaft portion. The MEMS device may further include a first stationary comb structure 401 affixed to a first sidewall of the lateral confinement and including first stationary comb fingers that are interdigitated with the respective set of movable comb fingers of the first movable comb structure 301. The MEMS device may further include a second stationary comb structure 402 affixed to a second sidewall of the lateral confinement and including second stationary comb fingers that are interdigitated with the second movable comb fingers. The MEMS device may further include a semiconductor oxide plate 12A including an oxide of the first semiconductor material 10 and coverings an entirety of a bottom surface of the center mass portion 10A.

Generally, the MEMS accelerometer of the present disclosure may be configured to detect displacement of the movable structure (10A, 30, 50) relative to the first stationary comb structure 401 and/or the second stationary comb structure 402 by sensing a change in capacitance of the capacitor structure including at least the first movable comb structure 401 and the first stationary comb structure 402. The capacitor structure may include the first movable comb structure 301, the second movable comb structure 302, the first stationary comb structure 401, and the second stationary comb structure 402.

Figure 13:
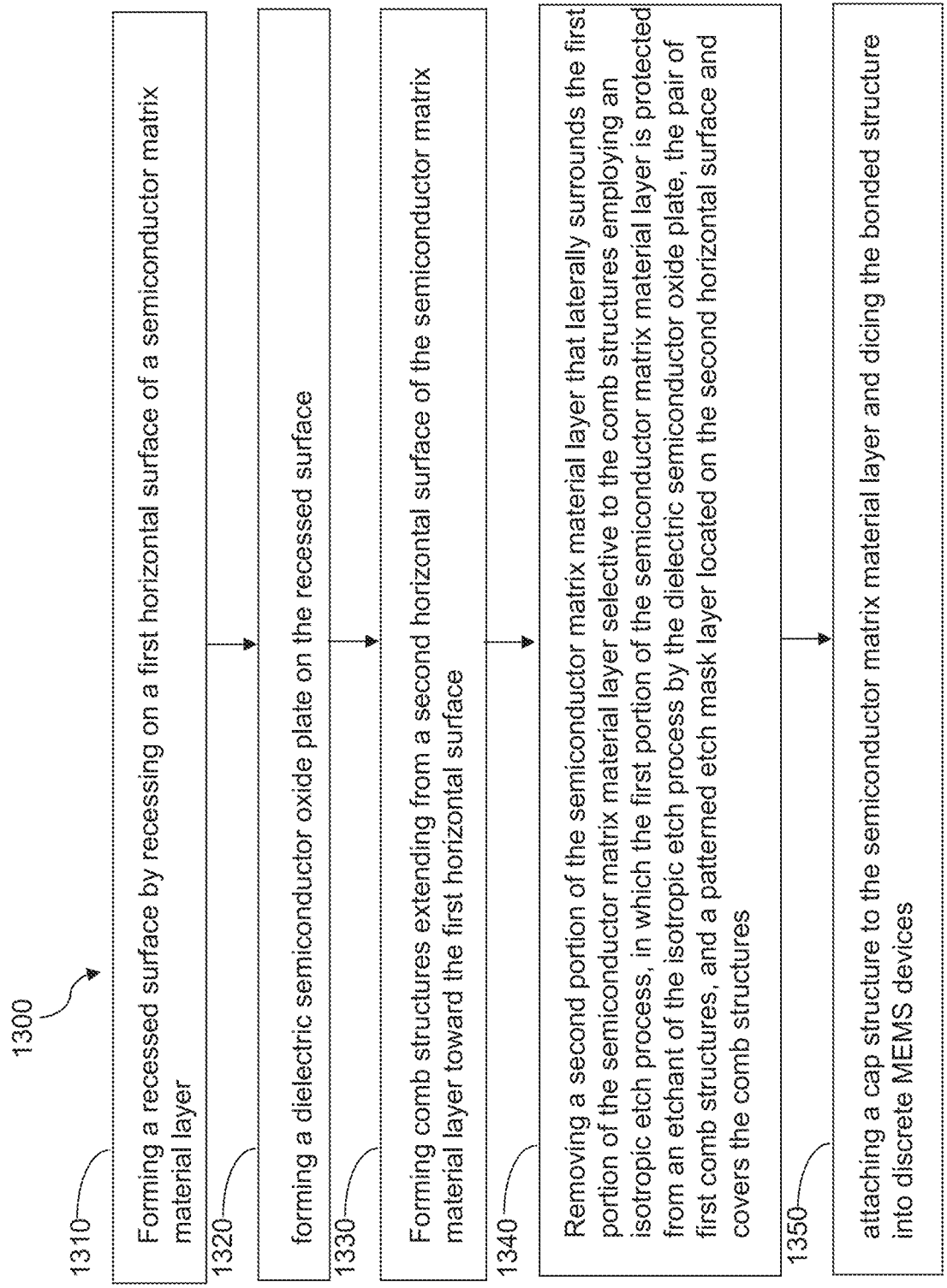
FIG. 13 is a flow chart illustrating a set of processing steps that may be performed to form a MEMS device according to embodiments of the present disclosure.

Referring to FIG. 13, a flow chart 1300 illustrates a set of processing steps that may be performed to form a MEMS device according to embodiments of the present disclosure. At step 1310, a recessed surface may be formed by recessing an area of a first horizontal surface 101 of a semiconductor matrix material layer 10. At step 1320, a semiconductor oxide plate (such as the first semiconductor oxide plate 12A) may be formed on the recessed surface. At step 1330, comb structures (30, 40) extending from a second horizontal surface 102 of the semiconductor matrix material layer 10 toward the first horizontal surface 101 of the semiconductor matrix material layer 10 may be formed in the semiconductor matrix material layer 10. The comb structures (30, 40) comprise a pair of inner comb structures 30 that are laterally spaced apart by a first portion of the semiconductor matrix material layer 10 and a pair of outer comb structures 40 that are interdigitated with the pair of inner comb structures. At step 1340, a second portion of the semiconductor matrix material layer 10 that laterally surrounds the first portion of the semiconductor matrix material layer 10 may be removed selective to the comb structures (30, 40) using an isotropic etch process. The first portion of the semiconductor matrix material layer 10 is protected from an etchant of the isotropic etch process by the semiconductor oxide plate 12A, the pair of inner comb structures 30, and a patterned etch mask layer 67 located on the second horizontal surface 102 and covers the comb structures (30, 40). At step 1350, a semiconductor die may be attached to the semiconductor matrix material layer 10M, and the handle substrate 20 may be thinned to provide an enclosure material layer 120. The bonded assembly may be diced to provide discrete MEMS devices including a respective accelerometer 100.

Thus, according to another aspect of the present disclosure, a method of forming a micro-electromechanical system (MEMS) accelerometer is provided, the method for forming MEMS device may include the operation of forming a recessed surface 13 by recessing an area of a first horizontal surface 101 of a semiconductor matrix material layer 10. The method may also include the operation of forming a semiconductor oxide plate 12A on the recessed surface 13. The method may include the operation of forming comb structures (301, 302) extending from a second horizontal surface 102 of the semiconductor matrix material layer 10 toward the first horizontal surface 101, wherein the comb structures comprise a pair of inner comb structures (301, 302) that are laterally spaced apart by a first portion of the semiconductor matrix material layer and a pair of outer comb structures 401, 402 that are interdigitated with the pair of inner comb structures (301, 302). The method further including the operation of removing a second portion of the semiconductor matrix material layer 10 that laterally surrounds the first portion of the semiconductor matrix material layer selective to the comb structures (301, 302, 401, 402) using an isotropic etch process, wherein the first portion 10A of the semiconductor matrix material layer 10 is protected from an etchant of the isotropic etch process by the semiconductor oxide plate 12A, the pair of inner comb structures 301, 302, and a patterned etch mask layer located on the second horizontal surface 102 and covers the comb structures.

In the various embodiments, a proof mass comprising a center mass portion 10A may be provided from the first portion of the semiconductor matrix material layer 10, which may have a uniform thickness due to the presence of the semiconductor oxide plate 12A at the bottom surface of the first portion of the semiconductor matrix material layer 10 and due to the presence of the patterned etch mask layer 67 at the top surface of the first portion of the semiconductor matrix material layer 10. Thus, random etching of the bottom surface of the proof mass that is present in prior art methods may be entirely avoided, and the center mass portion 10A may have a well defined mass, which may be determined with high precision by the pattern of the movable comb structures 30. The displacement of the movable comb structures 30 is proportional to the inertial force applied to the movable structure (10A, 30, 50), which is proportional to the product of the mass of the movable structure (10A, 30, 50) and acceleration of the movable structure (10A, 30, 50). Because the mass of the center mass portion 10A may be determined with high precision, the mass of the movable structure (10A, 30, 50) may be determined with high precision. Thus, measurement of the capacitance change in a capacitor including the movable structure (10A, 30, 50) and at least one of the stationary comb structures 40 may provide accurate measurement of the acceleration of the movable structure (10A, 30, 50), and thus, accurate measurement of the object to which the MEMS device is attached. A high accuracy measurement of acceleration may enhance accuracy of calculation of velocity and calculation of traveled distances as well as the accuracy of estimation of a force experienced by an object to which the accelerometer is attached.

The accelerometer 100 of the present disclosure may be used for a variety of applications that measures acceleration and/or rotation of any object such as a mobile device, an optical device, or a vehicle. In an illustrated example, the accelerometer 100 may be used as an actuator in an optical image stabilization system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electromechanical system (MEMS) accelerometer comprising:
a movable structure located in a lateral confinement, wherein the movable structure comprises a center mass portion including a portion of a first semiconductor material, a first movable comb structure affixed to a first side of the center mass portion, and a second movable comb structure affixed to a second side of the center mass portion, wherein each of the first movable comb structure and the second movable comb structure comprises a respective comb shaft portion and a respective set of movable comb fingers laterally protruding from the respective comb shaft portion;
a first stationary comb structure affixed to a first sidewall of the lateral confinement and including first stationary comb fingers that are interdigitated with the respective set of movable comb fingers of the first movable comb structure;
a second stationary comb structure affixed to a second sidewall of the lateral confinement and including second stationary comb fingers that are interdigitated with second movable comb fingers; and
a semiconductor oxide plate including an oxide of the first semiconductor material and covering a bottom surface of the center mass portion.

2. The MEMS accelerometer of claim 1, wherein each of the first movable comb structure, the second movable comb structure, the first stationary comb structure, and the second stationary comb structure comprises a respective dielectric liner that is physically exposed to a cavity within the lateral confinement and comprises a respective conductive fill material portion.

3. The MEMS accelerometer of claim 2, wherein the MEMS accelerometer is configured to detect displacement of the movable structure relative to the first stationary comb structure and the second stationary comb structure by sensing a change in capacitance of a capacitor structure including the first movable comb structure, the second movable comb structure, the first stationary comb structure, and the second stationary comb structure.

4. The MEMS accelerometer of claim 3, wherein the semiconductor oxide plate has a greater width than a lateral spacing between an interface between the center mass portion and the first movable comb structure and an interface between the center mass portion and the second movable comb structure.

5. The MEMS accelerometer of claim 4, wherein:
a peripheral portion of the semiconductor oxide plate is physically exposed to the cavity between neighboring pairs of movable comb fingers within the first movable comb structure and between neighboring pairs of movable comb fingers within the second movable comb structure;
the lateral confinement is located within an opening in a semiconductor matrix layer that comprises another portion of the first semiconductor material; and
each of the first movable comb structure, the second movable comb structure, the first stationary comb structure, and the second stationary comb structure comprises a respective conductive fill material portion having a different material composition than the first semiconductor material.

6. A micro-electromechanical system (MEMS) accelerometer comprising:
a movable structure located in a lateral confinement, wherein the movable structure comprises a center mass portion including a portion of a first semiconductor material, a first movable comb structure affixed to a first side of the center mass portion, and a second movable comb structure affixed to a second side of the center mass portion, wherein each of the first movable comb structure and the second movable comb structure comprises a respective comb shaft portion and a respective set of movable comb fingers laterally protruding from the respective comb shaft portion, wherein
the center mass portion comprises portion of a first semiconductor material;
a first stationary comb structure affixed to a first sidewall of the lateral confinement and including first stationary comb fingers that are interdigitated with the respective set of first movable comb fingers of the first movable comb structure; and
a second stationary comb structure affixed to a second sidewall of the lateral confinement and including second stationary comb fingers that are interdigitated with second movable comb fingers.

7. The MEMS accelerometer of claim 6, further comprising a semiconductor oxide plate including an oxide of the first semiconductor material and coverings an entirety of a bottom surface of the center mass portion.

8. The MEMS accelerometer of claim 7, wherein the semiconductor oxide plate has a greater width than a lateral spacing between the first movable comb structure and the second movable comb structure.

9. The MEMS accelerometer of claim 7, wherein the semiconductor oxide plate contacts a bottom surface of the first movable comb structure and a bottom surface of the second movable comb structure.

10. The MEMS accelerometer of claim 6, wherein the lateral confinement that is surrounded by a semiconductor frame comprising another portion of the first semiconductor material.

11. The MEMS accelerometer of claim 6, wherein each of the comb shaft portions comprises a respective dielectric liner that is physically exposed to a cavity within the lateral confinement and a respective conductive fill material portion that continuously extending into a respective set of movable comb fingers and laterally enclosed by the dielectric liner.

12. The MEMS accelerometer of claim 11, wherein the first stationary comb structure comprises an additional dielectric liner that is physically exposed to the cavity within the lateral confinement and additional conductive fill material portions located within a respective one of the first stationary comb fingers and laterally enclosed by the additional dielectric liner.

13. The MEMS accelerometer of claim 6, wherein the first stationary comb structure is attached to a suspension wall structure located within the lateral confinement.

14. The MEMS accelerometer of claim 13, wherein:
the suspension wall structure comprises a combination of a suspension spring fill material portion and a suspension spring dielectric liner; and
the suspension spring fill material portion comprises a same material as the inner comb shaft portion and the first movable comb fingers.

15. A method of forming a micro-electro mechanical system (MEMS) device, comprising:

forming a recessed surface by recessing an area of a first horizontal surface of a semiconductor matrix material layer;

forming a semiconductor oxide plate on the recessed surface;

forming comb structures extending from a second horizontal surface of the semiconductor matrix material layer toward the first horizontal surface, wherein the comb structures comprise a pair of inner comb structures that are laterally spaced apart by a first portion of the semiconductor matrix material layer and a pair of outer comb structures that are interdigitated with the pair of inner comb structures; and removing a second portion of the semiconductor matrix material layer that laterally surrounds the first portion of the semiconductor matrix material layer selective to the comb structures using an isotropic etch process, wherein the first portion of the semiconductor matrix material layer is protected from an etchant of the isotropic etch process by the semiconductor oxide plate, the pair of inner comb structures, and a patterned etch mask layer located on the second horizontal surface and covers the comb structures.

16. The method of claim 15, wherein:

a cavity is formed by removal of the second portion of the semiconductor matrix material layer;

a semiconductor matrix layer including a third portion of the semiconductor matrix material layer laterally surrounds the cavity; and a movable structure including a combination of the first portion of the semiconductor matrix material layer and the pair of inner comb structures is detached from the semiconductor matrix layer.

17. The method of claim 16, wherein forming the comb structures comprises:

forming comb trenches in the semiconductor matrix material layer, wherein each of the comb trenches extends from the second horizontal surface of the semiconductor matrix material layer toward the first horizontal surface of the semiconductor matrix material layer; and forming the comb structures within the comb trenches, wherein each of the comb structures comprise a respective dielectric liner and a respective conductive fill material portion.

18. The method of claim 17, further comprising:

forming a dielectric liner layer on physically exposed surfaces of the comb trenches;

depositing a conductive fill material in remaining volumes of the comb trenches after formation of the dielectric liner layer; and removing portions of the conductive fill material from outside the comb trenches, wherein each of the dielectric liners comprises a remaining portion of the dielectric liner layer and each of the conductive fill material portions comprises a remaining portion of the conductive fill material.

19. The method of claim 16, wherein:

the MEMS device comprises a MEMS accelerometer; and attaching a combination of the movable structure and the semiconductor matrix layer to a semiconductor structure including a semiconductor substrate, field effect transistors located on the semiconductor substrate, and metal interconnect structures formed within dielectric material layers, wherein the field effect transistors comprise a circuit configured to detect displacement of the movable structure relative to the pair of outer comb structures and the semiconductor matrix layer by sensing a change in capacitance of a capacitor structure including the pair of inner comb structures and the pair of outer comb structures.

20. The method of claim 16, further comprising:

forming an additional semiconductor oxide plate on the first horizontal surface of the semiconductor matrix material layer;

attaching the additional semiconductor oxide plate to a handle substrate prior to forming the comb trenches, wherein a lateral confinement is formed between the semiconductor oxide plate and the handle substrate;

forming the patterned etch mask layer on the second horizontal surface of the semiconductor matrix material layer by applying, and forming openings through, an etch mask material layer, wherein the openings are formed in areas that do not overlap with areas of the comb structures; and applying an isotropic etchant of the isotropic etch process through the openings in the patterned etch mask layer, wherein the isotropic etchant etches a material of the semiconductor matrix material layer selective to materials of the semiconductor oxide plate and the additional semiconductor oxide plate and selective to a material of the comb structures that contact the semiconductor matrix material layer.

* * * * *